(12) United States Patent
Kwon et al.

(10) Patent No.: US 11,888,476 B2
(45) Date of Patent: Jan. 30, 2024

(54) APPARATUS, MEMORY DEVICE AND METHOD FOR STORING PARAMETER CODES FOR ASYMMETRIC ON-DIE-TERMINATION

(71) Applicant: SAMSUNG ELECTRONICS CO., LTD., Suwon-si (KR)

(72) Inventors: Daehyun Kwon, Seoul (KR); Hyejung Kwon, Seoul (KR); Hyeran Kim, Uiwang-si (KR); Chisung Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 68 days.

(21) Appl. No.: 17/591,093

(22) Filed: Feb. 2, 2022

(65) Prior Publication Data

US 2022/0321125 A1  Oct. 6, 2022

(30) Foreign Application Priority Data

Mar. 31, 2021 (KR) .................. 10-2021-0042234
Jun. 11, 2021 (KR) .................. 10-2021-0076234

(51) Int. Cl.
*H03K 19/017* (2006.01)
*H03K 19/00* (2006.01)
(Continued)

(52) U.S. Cl.
CPC ... *H03K 19/01742* (2013.01); *H03K 19/0005* (2013.01); *H03K 19/1774* (2013.01); *H03K 19/17772* (2013.01)

(58) Field of Classification Search
CPC ......... H03K 19/0005; H03K 19/01742; H03K 19/1774; H03K 19/17772
See application file for complete search history.

(56) References Cited

U.S. PATENT DOCUMENTS 7,020,818 B2    3/2006 Dour et al.
7,180,327 B2 *  2/2007 So .................... G11C 5/04
                                              365/230.03
(Continued)

FOREIGN PATENT DOCUMENTS

KR    10-0604843 B1    7/2006

OTHER PUBLICATIONS

Communication dated Jan. 13, 2023 issued by the Taiwanese Patent Office in counterpart Taiwanese Patent Application No. 111111098.
(Continued)

*Primary Examiner* — Kurtis R Bahr
(74) *Attorney, Agent, or Firm* — Sughrue Mion, PLLC

(57) ABSTRACT

An apparatus, a memory device, and a method for storing parameter codes with respect to asymmetric on-die-termination (ODT) are provided. The apparatus is connected to an external device via a signal line, and includes: an on-die termination (ODT) circuit set in a first ODT state; a plurality of signal pins, each of which is connected to the signal line; and an ODT control circuit configured to: identify whether a second ODT state of the external device corresponds to the first ODT state, and based on the apparatus being an asymmetric ODT in which the first ODT state and the second ODT state are different, provide an asymmetric ODT parameter code to the external device, and disable the ODT circuit when a signal is not transmitted through the signal line.

20 Claims, 19 Drawing Sheets

(51) Int. Cl.
  *H03K 19/17736*  (2020.01)
  *H03K 19/17772*  (2020.01)

(56) References Cited

U.S. PATENT DOCUMENTS

| | | |
|---|---|---|
| 7,312,627 B2 | 12/2007 | An |
| 9,741,443 B2 | 8/2017 | Yu et al. |
| 10,291,275 B2 * | 5/2019 | Lee .................... H04L 25/03847 |
| 2007/0126469 A1 | 6/2007 | Kim et al. |
| 2008/0143386 A1 * | 6/2008 | Braun ............ H03K 19/017509 |
| | | 326/82 |
| 2012/0206165 A1 | 8/2012 | Ferolito et al. |
| 2015/0205751 A1 * | 7/2015 | Oh ....................... G06F 13/4221 |
| | | 710/106 |
| 2018/0097498 A1 * | 4/2018 | Lin ...................... G11C 7/1057 |
| 2019/0341085 A1 * | 11/2019 | Gans ................... G11C 7/1045 |
| 2021/0027827 A1 | 1/2021 | Kim et al. |
| 2022/0294445 A1 * | 9/2022 | Kim ................. H03K 19/17784 |

OTHER PUBLICATIONS

Communication dated Jul. 26, 2022 by the European Patent Office in counterpart European Patent Application No. 22154777.1.

* cited by examiner

APPARATUS, MEMORY DEVICE AND METHOD FOR STORING PARAMETER CODES FOR ASYMMETRIC ON-DIE-TERMINATION

CROSS-REFERENCE TO RELATED APPLICATIONS

This application is based on and claims priority to Korean Patent Application No. 10-2021-0042234, filed on Mar. 31, 2021, in the Korean Intellectual Property Office, and Korean Patent Application No. 10-2021-0076234, filed on Jun. 11, 2021, in the Korean Intellectual Property Office, the disclosures of which are incorporated by reference herein in their entireties.

BACKGROUND

Methods, apparatuses and systems consistent with example embodiments relate storing parameter codes with respect to asymmetric on-die-termination (ODT).

A semiconductor device may include an input/output (I/O) interface that operates at a high speed, for example, a serial interface that includes a transmitter and a receiver. The serial interface may sequentially transmit a plurality of bits, one by one, through one line. In order to prevent distortion of a transmitted signal and provide signal integrity, an ODT circuit may be included in the I/O interface. When a signal is transmitted from the transmitter to the receiver, the ODT circuit of the receiver may provide a termination resistance on the signal line.

When the signal output from the transmitter swings from a half power voltage level to a full power voltage level (e.g., from VDDQ/2 to VDDQ), the ODT circuit of the receiver may provide a termination resistance as a resistance value of a pull-up circuit connected to the power voltage VDDQ. Alternatively, when the signal output from the transmitter half swings from a ground voltage level to the half power voltage level (e.g., from ground to VDDQ/2), the ODT circuit of the receiver may provide a termination resistance as a resistance value of a pull-down circuit connected to the ground voltage VSSQ. That is, the ODT circuit of the receiver may be symmetrically configured to be connected to the same voltage (e.g., the power voltage VDDQ or the ground voltage VSSQ) in response to an output signal level of the transmitter.

However, the receiver may configure an asymmetric ODT circuit in which the ODT circuit is connected to different voltages with respect to an output signal of the transmitter according to an operating performance of the receiver. In this case, the transmitter/receiver needs to control the asymmetric ODT considering power consumption.

SUMMARY

The inventive concept provides an apparatus for storing parameter codes with respect to asymmetric on-die-termination (ODT), a memory device and an operating method thereof.

According to an aspect of an example embodiment, an apparatus that is connected to an external device via a signal line, includes: an on-die termination (ODT) circuit set in a first ODT state; a plurality of signal pins, each of which is connected to the signal line; and an ODT control circuit configured to: identify whether a second ODT state of the external device corresponds to the first ODT state, and based on the apparatus being an asymmetric ODT in which the first ODT state and the second ODT state are different, provide an asymmetric ODT parameter code to the external device, and disable the ODT circuit when a signal is not transmitted through the signal line.

According to an aspect of an example embodiment, an apparatus includes a plurality of signal pins, wherein the apparatus is connected to an external device through a signal line connected to a signal pin among the plurality of signal pins; an on-die termination (ODT) circuit connected to the signal line, the ODT circuit being set to a first ODT state; a mode register configured to store a first parameter code corresponding to a first operating condition of the ODT circuit and a second parameter code corresponding to a second operating condition of the ODT circuit; and a control circuit configured to set the ODT circuit to the first operating condition using the first parameter code in a symmetric ODT where a second ODT state of the external device corresponds to the first ODT state, and set the ODT circuit to the second operating condition using the second parameter code in an asymmetric ODT where the second ODT state of the external device is different from the first ODT state.

According to an aspect of an example embodiment, A method of setting a current operating condition of an apparatus is provided. The method includes: storing a first parameter code corresponding to a first operating condition with respect to an operating parameter in a mode register as a default operating condition; updating the mode register with a second parameter code corresponding to a second operating condition with respect to the operating parameter; setting the current operating condition as the first operating condition using the first parameter code; and setting the current operating condition as the second operating condition using the second parameter code. The operating parameter relates to an on-die termination (ODT) circuit of the apparatus. When the ODT circuit is set to a first ODT state and an external device connected to a signal line connected to the ODT circuit is set to a second ODT state, the first parameter code is provided in a symmetric ODT where the second ODT state corresponds to the first ODT state, and the second parameter code is provided in an asymmetric ODT where the second ODT state is different from the first ODT state.

According to an aspect of an example embodiment, An apparatus for checking an on-die termination (ODT) state is provided. The apparatus includes: a first device including a first controller and a first ODT circuit connected to a first pin and set to a first ODT state; and a second device including a second controller and a second ODT circuit connected to a second pin and set to a second ODT state, wherein the second pin is connected to the first pin through a signal line. The first controller is configured to disable the first ODT circuit when the apparatus is an asymmetric ODT in which the first ODT state and the second ODT state are different and a signal is not transmitted through the signal line, and the second controller is configured to disable the second ODT circuit when the apparatus is the asymmetric ODT and the signal is not transmitted through the signal line.

BRIEF DESCRIPTION OF THE DRAWINGS

The above and other objects, features and advantages will be more apparent from the following description, taken in conjunction with the accompanying drawings in which.

DETAILED DESCRIPTION

Figure 1:
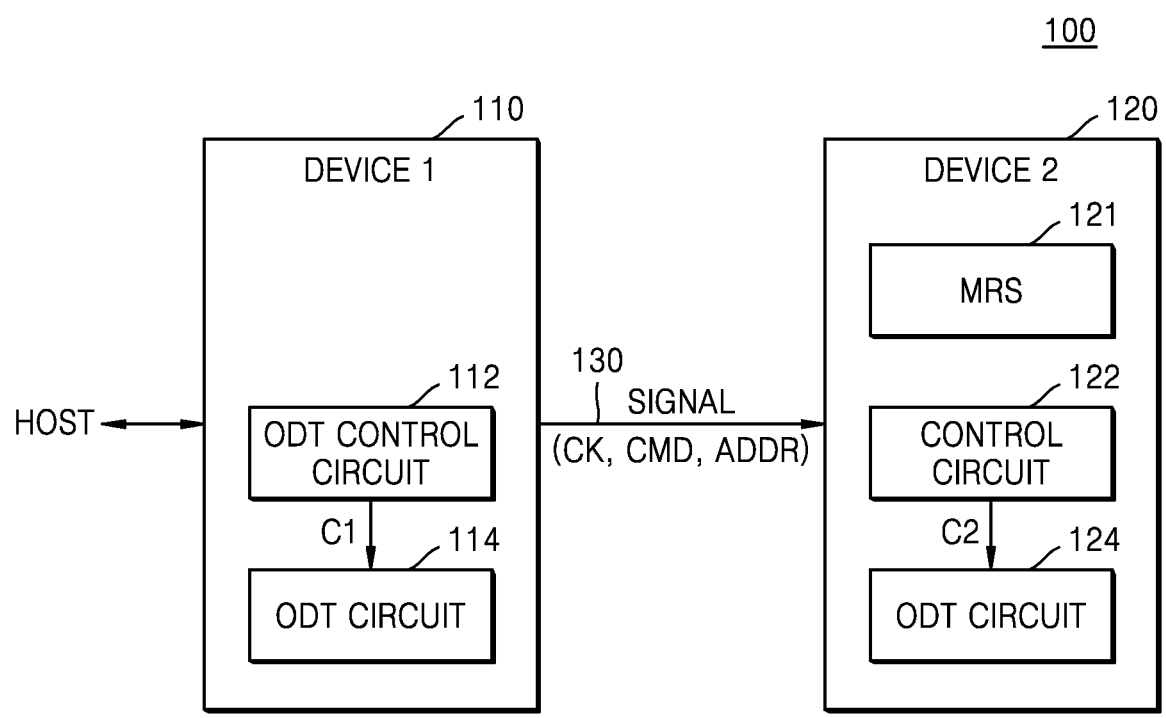
FIG. 1 is a block diagram illustrating an apparatus including on-die-termination (ODT) circuits according to example embodiments.

FIG. 1 is a block diagram illustrating an apparatus 100 including on-die-termination (ODT) circuits according to example embodiments.

Referring to FIG. 1, the apparatus 100 may include a first device 110 and a second device 120. The apparatus 100 may be implemented to be included in a personal computer (PC) or a mobile electronic device. The mobile electronic device may be implemented as a laptop computer, a mobile phone, a smartphone, a tablet PC, a personal digital assistant (PDA), an enterprise digital assistant (EDA), a digital still camera, a digital video camera, a portable multimedia player (PMP), a personal navigation device or a portable navigation device (PND), a handheld game console, a mobile Internet device (MID), a wearable computer, an Internet of Things (IoT) device, an Internet of Everything (IoE) device, or a drone.

The first device 110 may be implemented as an integrated circuit (IC), a system on a chip (SoC), an application processor (AP), a mobile AP, a chipset, or a set of chips. As an example, the first device 110 may be a semiconductor device that performs a memory control function, and the first device 110 may be a component included in the AP. The AP may include a memory controller, RAM, a central processing unit (CPU), a graphics processing unit (GPU), and/or a modem.

The second device 120 may be implemented as a volatile memory device. The volatile memory device may be implemented as random access memory (RAM), dynamic RAM (DRAM), or static RAM (SRAM), but is not limited thereto. For example, the second device 120 may include double data rate synchronous dynamic random access memory (DDR SDRAM), low power double data rate (LPDDR), SDRAM, graphics double data rate (GDDR), SDRAM, Rambus dynamic random access memory (RDRAM), etc. Alternatively, the second device 120 may be implemented as a high bandwidth memory (HBM).

The second device 120 may be implemented as a non-volatile memory device. For example, the second device 120 may be implemented as a resistive memory such as phase change RAM (PRAM), magnetic RAM (MRAM), resistive RAM (RRAM), etc.

A signal may be transmitted between the first device 110 and the second device 120 through a signal line 130. For the sake of brevity of the drawing, although it is illustrated that the signal is transmitted through one signal line between the first device 110 and the second device 120, the signal may be actually transmitted through a plurality of signal lines or a bus. The signal line(s) 130 between the first device 110 and the second device 120 may be connected through connectors. The connectors may be implemented as pins, balls, signal lines, or other hardware components.

The signal transmitted through the signal line 130 may include, for example, a clock signal CK, a command signal CMD, and/or an address signal ADDR, and may be transmitted through the plurality of signal line(s) 130. The command signal CMD and the address signal ADDR may be referred to as a command/address CA signal. The second device 120 may receive the clock signal CK, the command signal CMD, and/or the address signal ADDR from the first device 110, and generate an internal signal corresponding to a function of the received clock signal CK, command signal CMD, and/or address signal ADDR. The second device 120 may perform a memory operation such as selecting a row and a column corresponding to a memory cell, writing data into the memory cell, or reading the written data according to the internal signal. Write data and read data transmitted/received between the first device 110 and the second device 120 will be described as a data signal DQ in FIG. 8.

The first device 110 may control the second device 120 to read data stored in the second device 120 or write data to the second device 120 in response to a write/read request from the host HOST. The first device 110 may provide the second device 120 with the clock signal CK, the command signal CMD, and/or the address signal ADDR, thereby controlling data write and/or read operations on the second device 120. As the second device 120 receives write data using the clock signal CK from the first device 110, the clock signal CK may be referred to as a write clock signal.

The first device 110 may check a termination state of the signal line 130. The first device 110 may include an ODT control circuit 112 used to check the termination state of the signal line 130 and an ODT circuit 114 connected to the signal line 130. The ODT control circuit 112 may request ODT information of the signal line 130 to the second device 120, and receive ODT information of the signal line 130 from the second device 120. The ODT control circuit 112 may check the ODT state of the second device 120 included in the received ODT information and its ODT state implemented in the ODT circuit 114 of the first device 110.

For example, the ODT control circuit 112 may check whether the ODT state of the first device 110 and the ODT state of the second device 120 are the same or different. The ODT control circuit 112 may check whether the ODT state of the first device 110 and the ODT state of the second device 120 are equally terminated with a resistance value of a pull-up circuit or a resistance value of a pull-down circuit. Alternatively, the ODT control circuit 112 may check whether the ODT state of the first device 110 is terminated with the resistance value of the pull-up circuit and the ODT state of the second device 120 is terminated with the resistance value of the pull-down circuit or whether the ODT state of the first device 110 is terminated with the resistance value of the pull-down circuit and the ODT state of the second device 120 is terminated with the resistance value of the pull-up circuit such that the ODT state of the first device 110 and the ODT state of the second device 120 are different from each other.

When the ODT control circuit 112 determines that the ODT state of the first device 110 and the ODT state of the second device 120 are different from each other, the first device 110 may provide an asymmetric termination parameter code to the second device 120. The asymmetric termination parameter code may be transmitted to the second device 120 through the signal line 130. The ODT control circuit 112 may generate a first ODT control signal C1 based on the ODT state of the first device 110 and the ODT state of the second device 120 being different from each other, and provide the first ODT control signal C1 to the ODT circuit 114. The ODT circuit 114 may perform an ODT enable or disable operation according to the first ODT control signal C1.

The second device 120 may include a mode register set 121 (hereinafter referred to as 'MRS'), a control circuit 122 and an ODT circuit 124. The MRS 121 may be programmed to set operating parameters, options, various functions, characteristics, and modes of the second device 120. The MRS 121 may include a register that stores parameter codes with respect to various operation and control parameters used to set operating conditions of the second device 120. The MRS 121 may store a parameter code including appropriate bit values provided to command/address signal lines when an MRS command is issued from the first device 110. The MRS 121 may store the asymmetric termination parameter code transmitted from the first device 110 through the command/address signal lines. The asymmetric termination parameter code will be described later with reference to FIG. 14.

The control circuit 122 may receive the clock signal CK through the signal line 130 and control the operation timing of the second device 120. The operation timing of the second device 120 may be provided based on a signal provided to the second device 120 in addition to the clock signal CK, for example, a strobe signal. The control circuit 122 may receive the command signal CMD received through the signal line 130 and generate control signals for performing various memory operations in the second device 120 in response to the command signal CMD. The control circuit 122 may generate a second ODT control signal C2 based on the asymmetric termination parameter code stored by the MRS 121 and provide the second ODT control signal C2 to the ODT circuit 124. The ODT circuit 124 may perform the ODT enable or disable operation according to the second ODT control signal C2.

Figure 2:
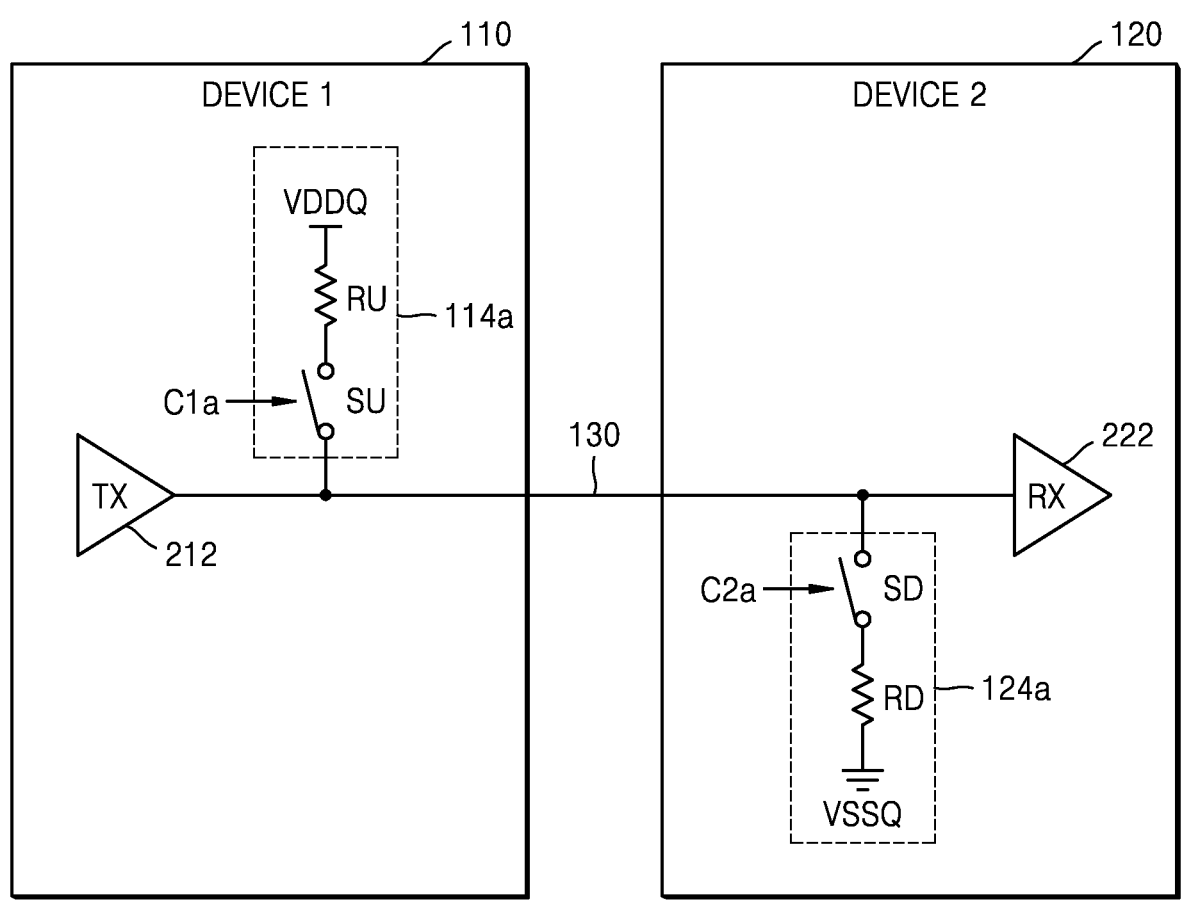
FIGS. 2 and 3 are diagrams conceptually illustrating the ODT circuits of FIG. 1.
Figure 3:
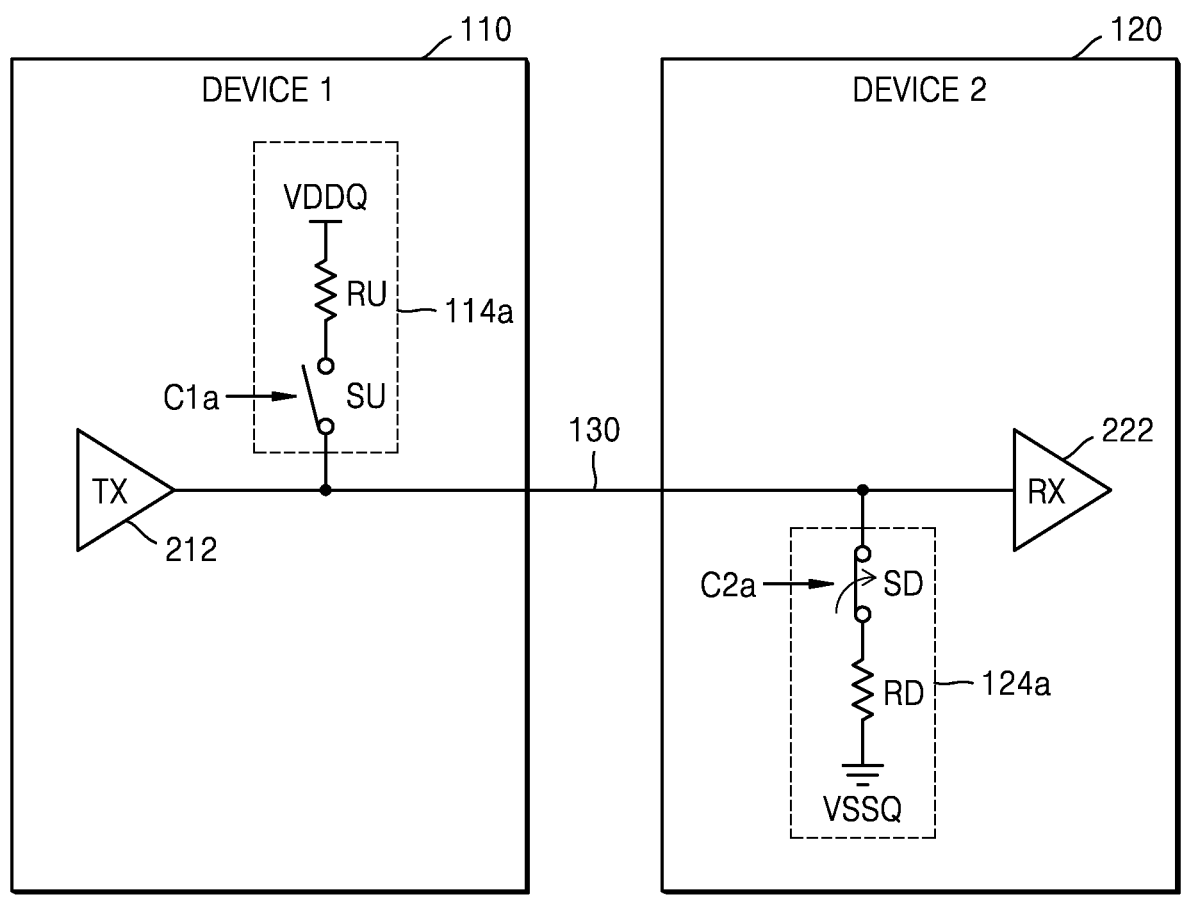

FIGS. 2 and 3 are diagrams conceptually illustrating ODT circuits 114a and 124a of FIG. 1. Hereinafter, subscripts (e.g., a in 114a and b in 114b) attached to the reference numbers are used to distinguish a plurality of circuits having similar functions. For example, the ODT circuit 114, the ODT circuit 114a and ODT circuit 114b have similar functions.

Referring to FIG. 2, a transmitter 212 of the first device 110 and a receiver 222 of the second device 120 may be connected to each other through the signal line 130. The first device 110 may include the ODT circuit 114a connected to the signal line 130, and the ODT circuit 114a may be configured as a pull-up circuit connected to a power voltage (VDDQ) line. The ODT circuit 114a may include a pull-up resistor RU connected between the power voltage VDDQ line and the signal line 130 and a pull-up switch SU arranged in correspondence to the pull-up resistor RU. The pull-up switch SU may be turned on or off according to a first ODT control signal C1a. The first ODT control signal C1a may be generated by the ODT control circuit 112. When the pull-up switch SU is turned on by the first ODT control signal C1a, the ODT circuit 114a may be ODT enabled. When the pull-up switch SU is turned off, the ODT circuit 114a may be ODT disabled.

The second device 120 may include the ODT circuit 124a connected to the signal line 130, and the ODT circuit 124a may be configured as a pull-down circuit connected to a ground voltage VSSQ line. The ODT circuit 124a may include a pull-down resistor RD connected between the signal line 130 and the ground voltage VSSQ line and a pull-down switch SD arranged in correspondence to the pull-down resistor RD. The pull-down switch SD may be turned on or off according to a second ODT control signal C2a. The second ODT control signal C2a may be generated by the control circuit 122. When the pull-down switch SD is turned on by the second ODT control signal C2a, the ODT circuit 124a may be ODT enabled. When the pull-down switch SD is turned off, the ODT circuit 124a may be ODT disabled.

The ODT circuit 114a of the first device 110 is configured as a pull-up circuit connected to the power voltage VDDQ, whereas the ODT circuit 124a of the second device 120 is configured as a pull-down circuit connected to the ground voltage VSSQ line, and thus the first device 110 may confirm that the signal line 130 is in an asymmetric ODT state through an ODT state check operation.

FIG. 2 shows a state in which when a signal is not transmitted through the signal line 130, the pull-up switch SU and the pull-down switch SD are turned off so that the ODT circuits 114a and 124a of the first and second devices 110 and 120 are disabled. Accordingly, during a signal non-transmission, the signal line 130 may maintain a high-impedance state.

Referring to FIG. 3, when a signal is transmitted from the first device 110 to the second device 120 through the signal line 130, the pull-down switch SD of the second device 120 is turned on so that the ODT circuit 124a may be ODT enabled. The pull-down resistor RD of the ODT circuit 124a may act as a termination resistor of the signal line 130. At this time, the ODT circuit 114a of the first device 110 will be ODT disabled.

Figure 4:
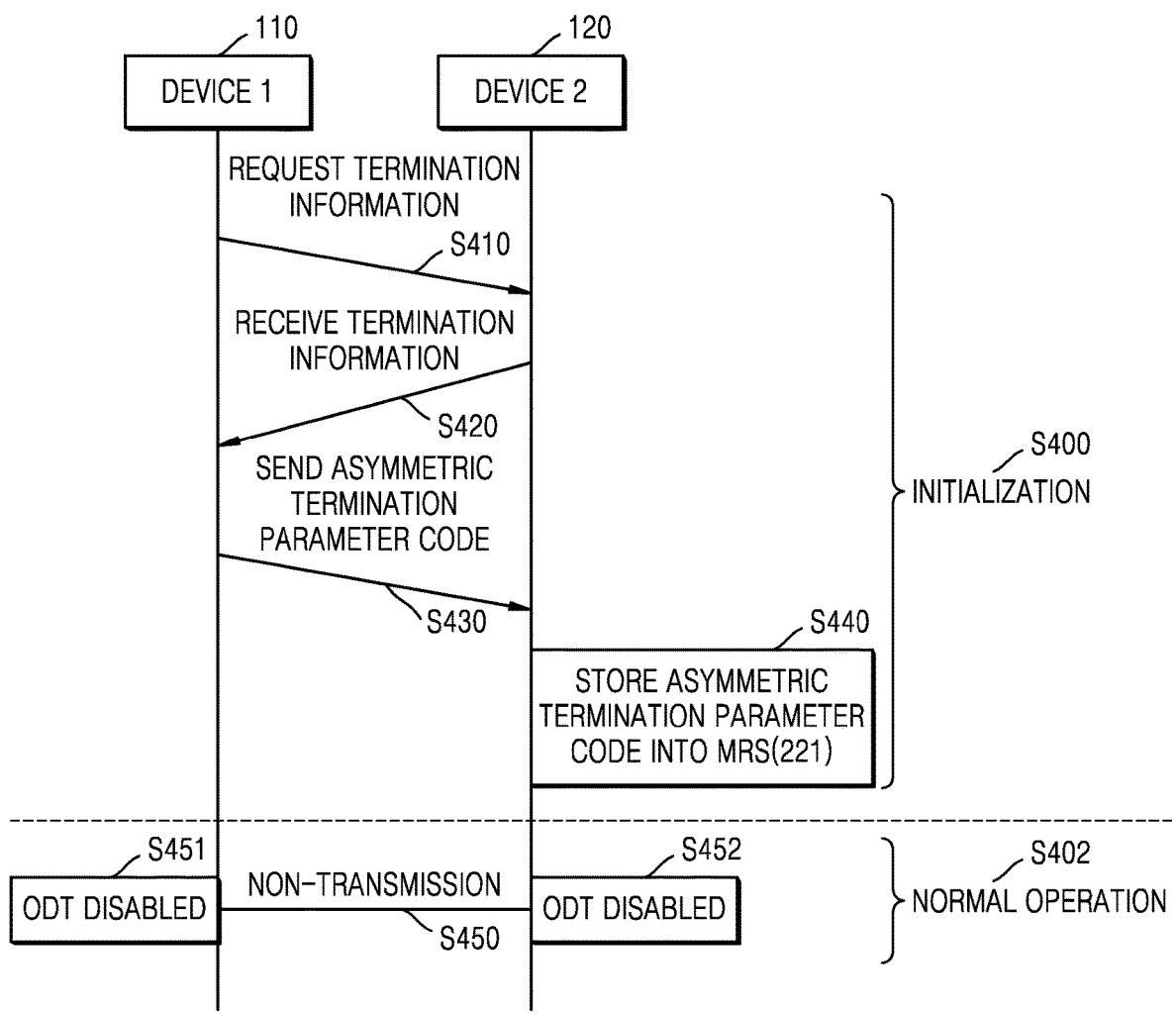
FIG. 4 is a diagram illustrating an operation of the apparatus of FIG. 1.

FIG. 4 is a diagram illustrating an operation of the apparatus 100 of FIG. 1.

Referring to FIGS. 1 to 4, the apparatus 100 may perform a normal operation (S402) after performing an initialization operation (S400). The initialization operation (S400) may be performed when the apparatus 100 is powered up. In the initialization operation (S400), an initial setting operation may be performed according to a method determined between the first device 110 and the second device 120. In the initialization operation (S400), a default operation parameter code of the second device 120 may be set in the MRS 121.

In the initialization operation (S400), codes indicating a frequency, timing, driving, detailed operation parameters, etc., of the second device 120 may be set so that the first device 110 may operate normally with the second device 120. For example, when the second device 120 is a memory device, the first device 110 may perform memory core parameter training associated with a memory core of the second device 120 and/or peripheral circuit parameter training on peripheral circuits other than the memory core. The first device 110 may determine an optimal parameter code on the memory core parameters of the second device 120 and/or peripheral circuit parameters.

The optimal parameter code determined in the initialization operation (S400) may be provided to the second device 120 and stored in the MRS 121. The second device 120 may perform the normal operation (S402) according to the parameter code stored in the MRS 121. The normal operation (S402) may be performed to operate as the parameter code stored in the MRS 121 of the second device 120 when data write and/or read operations on the second device 120 are performed under the control of the first device 110.

During the initialization operation (S400), the first device 110 may request termination information of the signal line 130 and/or a data line 830 (FIG. 8) from the second device 120 (S410). For example, ODT circuits 124a and 124c (FIG. 8) of the second device 120 connected to the signal line 130 and/or the data line 830 may be configured as a pull-down circuit connected to the ground voltage VSSQ line. The second device 120 may provide pull-down termination information of the signal line 130 and/or the data line 830 to the first device 110.

The first device 110 may receive pull-down termination information of the signal line 130 and/or the data line 830 from the second device 120 (S420). For example, the ODT circuit 114a of the first device 110 connected to the signal line 130 and/or the data line 830 may be configured as a pull-up circuit connected to the power voltage VDDQ. The first device 110 may confirm that its ODT circuit 114a and the ODT circuit 124a of the second device 120 are in an asymmetric ODT state in which the ODT circuit 114a and the ODT circuit 124a are connected to different voltages.

The first device 110 may send an asymmetric ODT parameter code to the second device 120 (S430). For example, the ODT control circuit 112 may control the asymmetric ODT parameter code to be sent to the second device 120. The second device 120 may receive the asymmetric ODT parameter code and store the asymmetric ODT parameter code in the MRS 121 (S440). For example, the control circuit 122 may receive the asymmetric ODT parameter code and control the asymmetric ODT parameter code to be stored in the MRS 121.

After the initialization operation (S400), in order to perform data write and/or read operations between the first device 110 and the second device 120 during the normal operation (S402) the clock signal CK, the command/address signal CA, and/or the data signal DQ may be transmitted through the signal line 130 and/or the data line 830. When the clock signal CK, the command/address signal CA, and/or the data signal DQ are not transmitted during the normal operation (S402) through the signal line 130 and/or the data line 830 (S450), the first device 110 may disable the ODT circuit 114a using the first ODT control signal C1a (S451), and the second device 120 may disable the ODT circuit 124a using the second ODT control signal C2a (S452).

Figure 5:
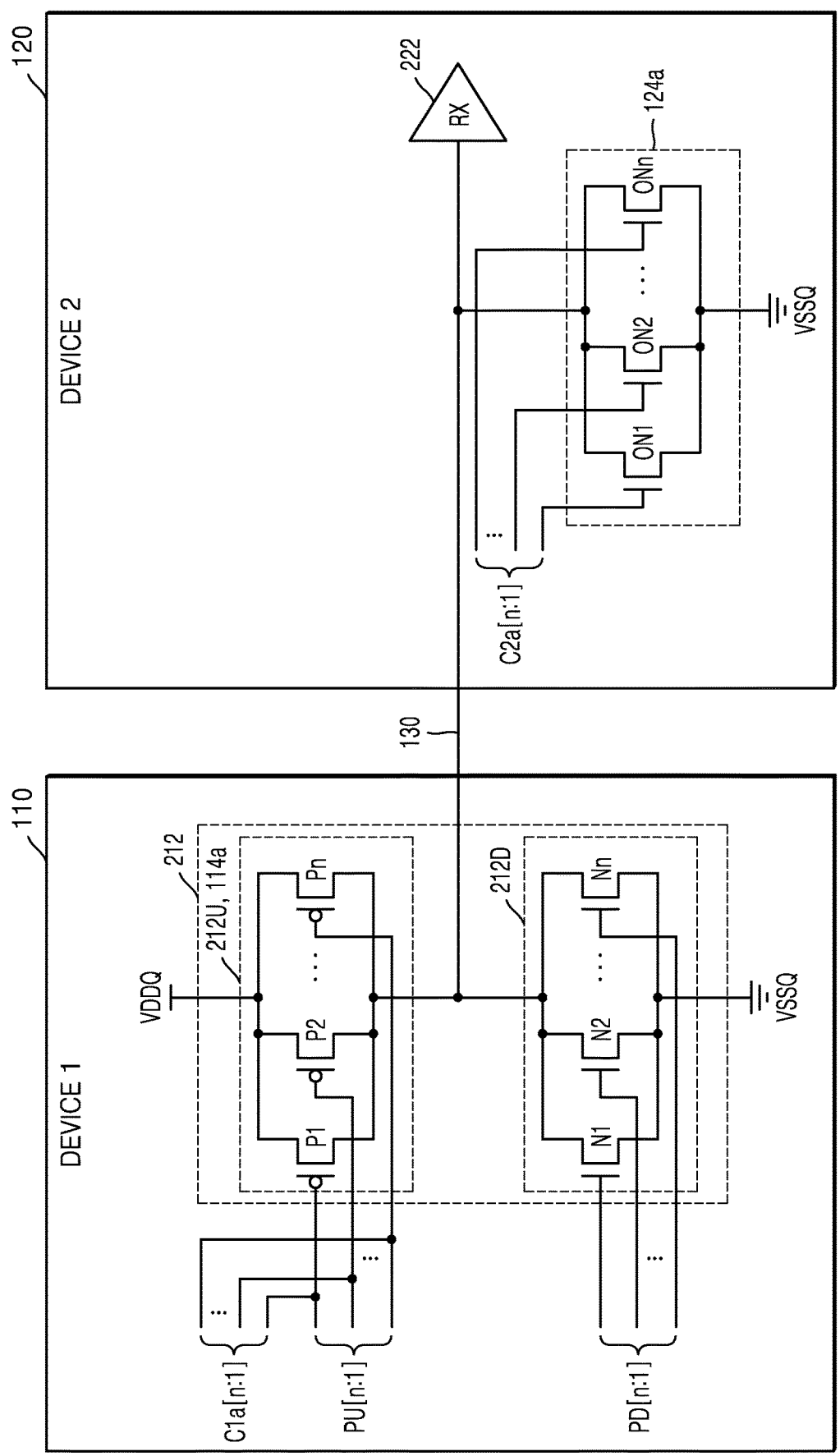
FIG. 5 is a circuit diagram illustrating the ODT circuits of FIG. 2.

FIG. 5 is a circuit diagram illustrating the ODT circuits 114a and 124a of FIG. 2.

Referring to FIGS. 2 and 5, the transmitter 212 of the first device 110 may include a pull-up circuit 212U and a pull-down circuit 212D connected to the signal line 130. The pull-up circuit 212U may include a plurality of PMOS transistors P1 to Pn connected to the power voltage line VDDQ and the signal line 130, and arranged in parallel. Each of the PMOS transistors P1 to Pn may be turned on or off according to a pull-up drive code PU[n:1] corresponding thereto. The PMOS transistors P1 to Pn corresponding to a bit value "0" of the pull-up drive code PU[n:1] are turned on so that the signal line 130 may be driven at a logic high level. As additional transistors of the PMOS transistors P1 to Pn are turned on, the driving capability of the pull-up circuit 212U may be increased.

The pull-down circuit 212D may include a plurality of NMOS transistors N1 to Nn connected between the signal line 130 and the ground voltage VSSQ line, and arranged in parallel. Each of the NMOS transistors N1 to Nn may be turned on or off according to a pull-down drive code PD[n:1] corresponding thereto. The NMOS transistors N1 to Nn corresponding to a bit value "1" of the pull-down drive code PD[n:1] are turned on so that the signal line 130 may be driven at a logic low level. As additional transistors of the NMOS transistors N1 to Nn are turned on, the driving capability of the pull-down circuit 212D may be increased.

The transmitter 212 of the first device 110 may transmit a signal through the signal line 130 based on the pull-up drive code (PU[n:1]) and the pull-down drive code (PD[n:1]). FIG. 5 shows that the pull-up circuit 212U includes PMOS transistors and the pull-down circuit 212D includes NMOS transistors, but example embodiments are not limited thereto. As an example, each of the pull-up circuit 212U and the pull-down circuit 212D may include NMOS transistors or PMOS transistors. As another example, each of the pull-up circuit 212U and the pull-down circuit 212D may include both NMOS transistors and PMOS transistors.

The second device 120 may receive a signal transmitted through the signal line 130. When the receiver 222 receives the signal, the ODT circuit 124a of the second device 120 may provide a termination resistance through the signal line 130. The ODT circuit 124a may include a plurality of NMOS transistors ON1 to ONn connected between the signal line 130 and the ground voltage line VSSQ, and arranged in parallel. Each of the NMOS transistors ON1 to ONn may be turned on or off according to a second ODT control signal C2a[n:1] of n bits corresponding thereto. The second ODT control signal C2a[n:1] may be generated by the control circuit 122. A resistance value according to an on/off state of each of the NMOS transistors ON1 to ONn may be provided as a termination resistance of the signal line 130.

When the transmitter 212 does not transmit a signal through the signal line 130, the pull-up drive code PU[n:1] and the pull-down drive code PD[n:1] are not provided. In this regard, the pull-up circuit 212U may operate as the ODT circuit 114a of the signal line 130. During a signal non-transmission, all of the PMOS transistors P1 to Pn of the pull-up circuit 212U may be turned off according to a first ODT control signal C1a[n:1] of n bits. The first ODT control signal C1a[n:1] may be generated by the ODT control circuit 112. Accordingly, the ODT circuit 114a of the first device 110 may be disabled. Also, all of the NMOS transistors ON1 to ONn of the ODT circuit 124a of the second device 120 may be turned off according to a second ODT control signal C2a[n:1] of n bits. Accordingly, the ODT circuit 124a of the second device 120 may be disabled. During the signal non-transmission, the ODT circuits 114a and 124a of the first and second devices 110 and 120 are disabled, and thus, the signal line 130 may maintain a high-impedance state.

Figure 6:
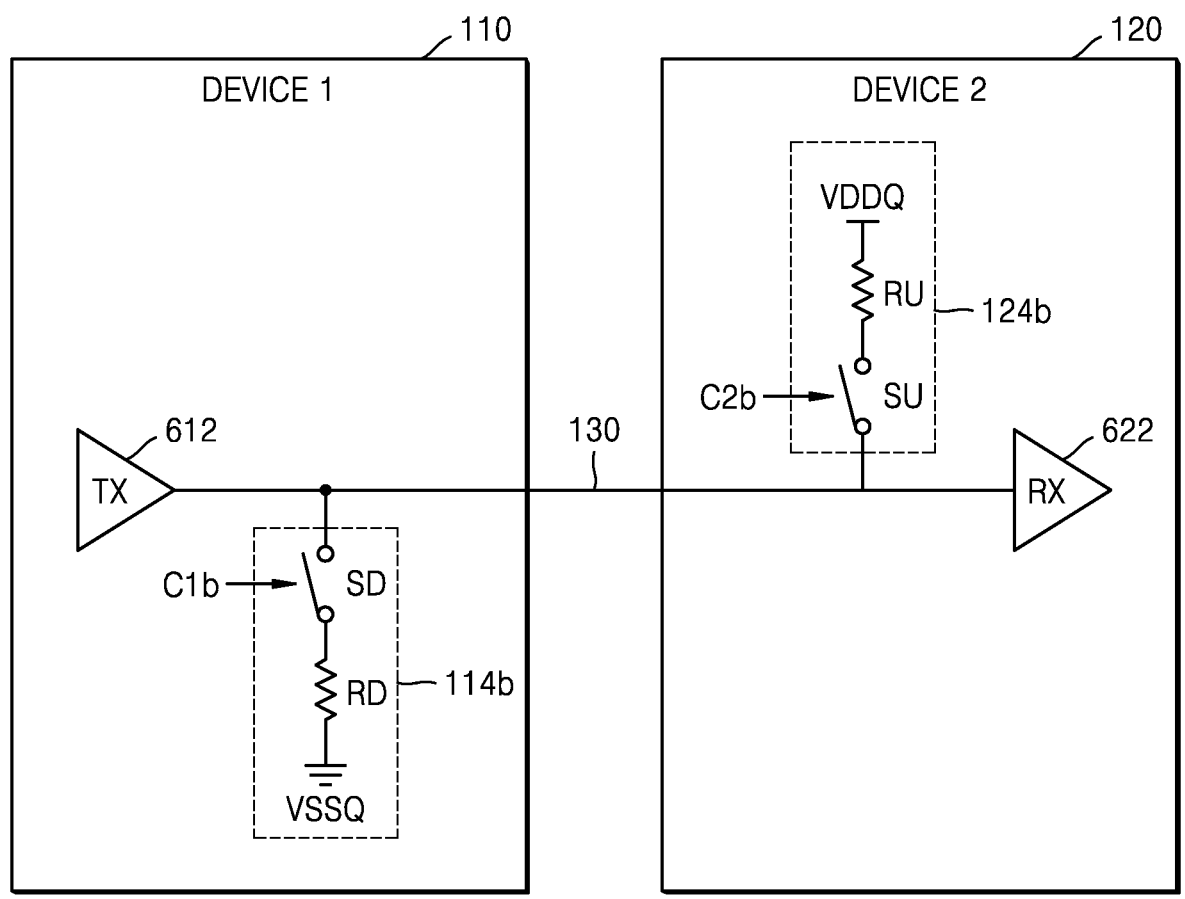
FIG. 6 is a diagram conceptually illustrating the ODT circuits of FIG. 1.
Figure 7A:
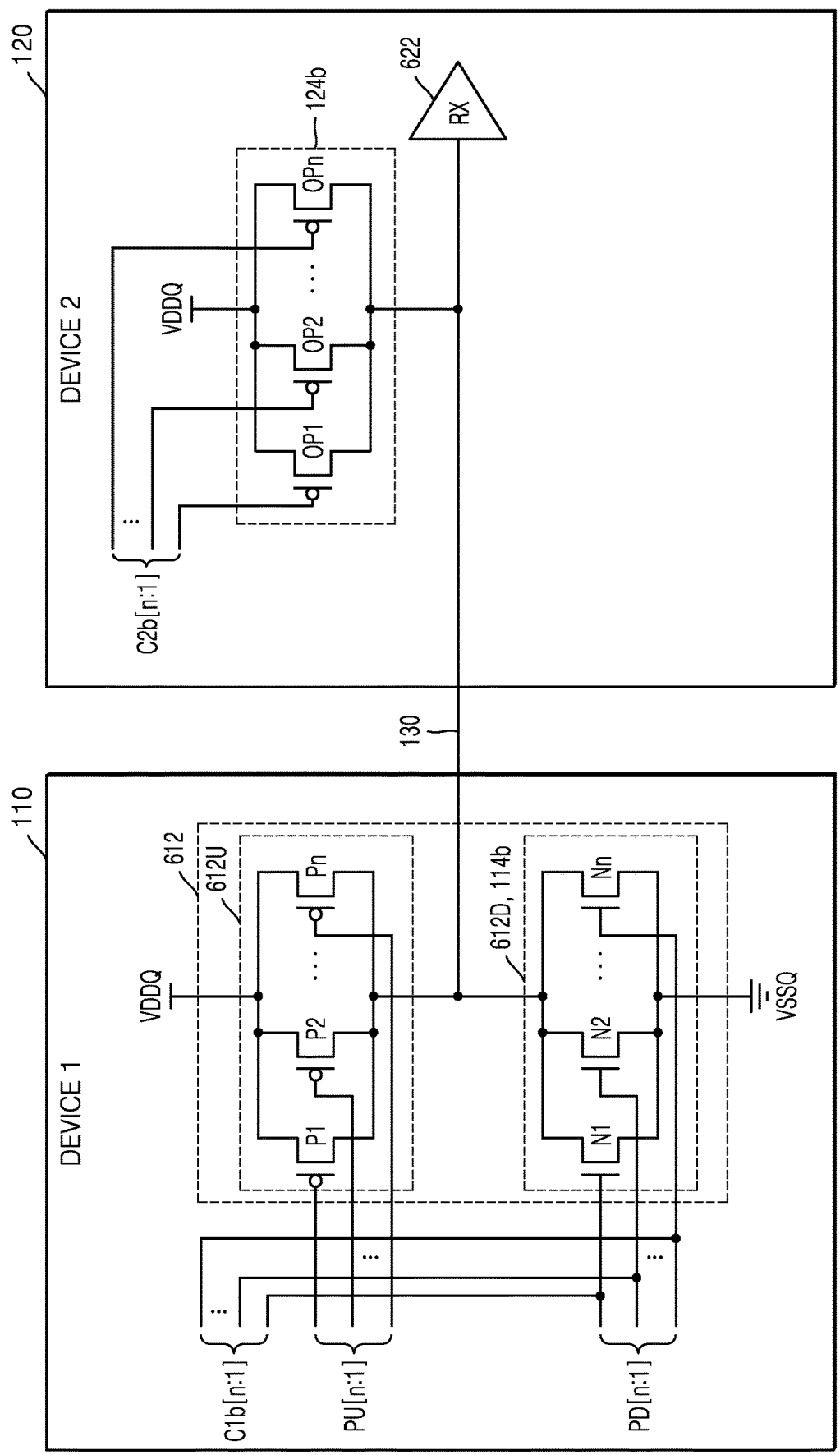
FIGS. 7A and 7B are circuit diagrams illustrating the ODT circuits of FIG. 6.
Figure 7B:
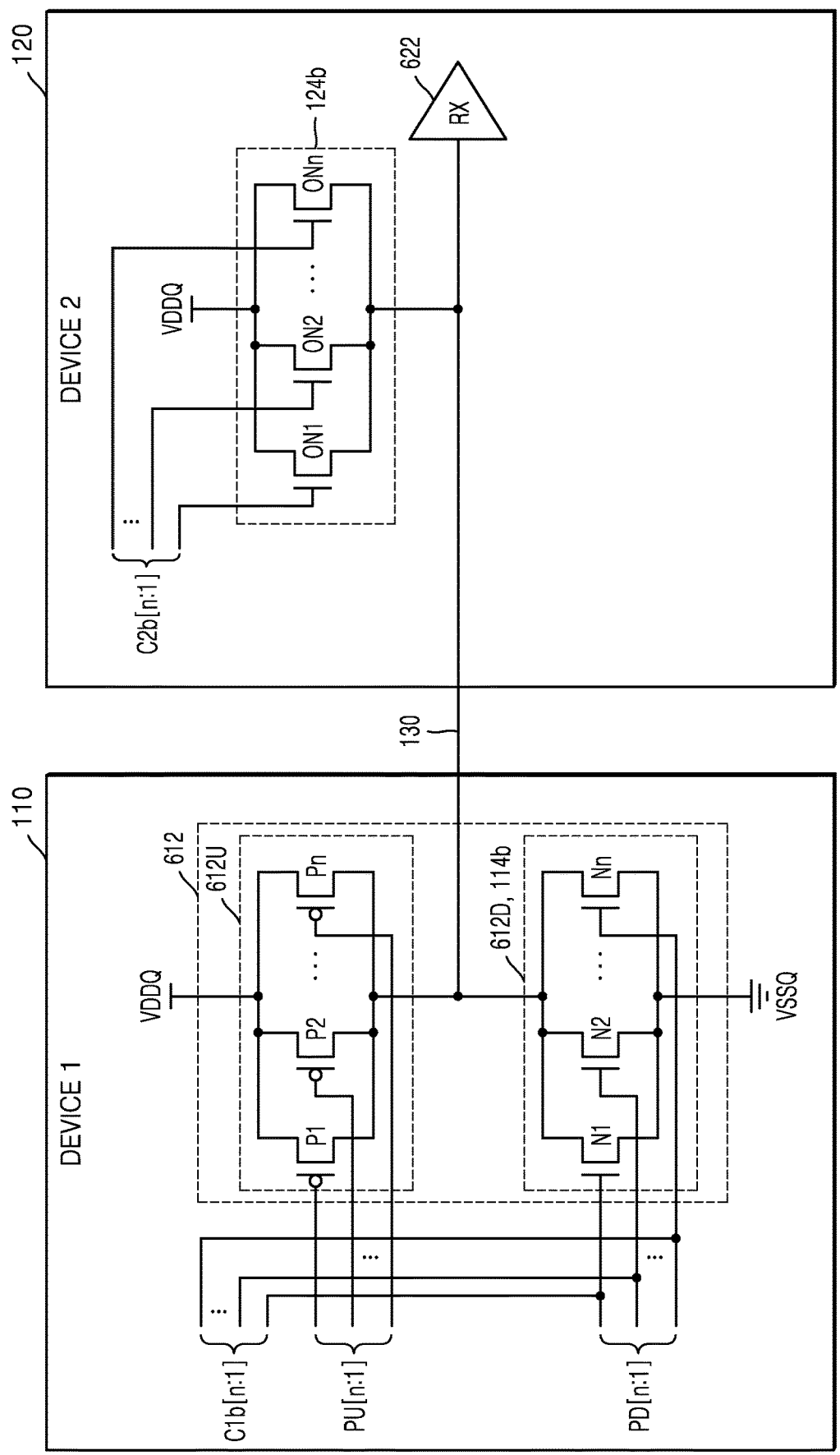

FIG. 6 is a diagram conceptually illustrating ODT circuits 114b and 124b of FIG. 1, and FIGS. 7A and 7B are circuit diagrams illustrating the ODT circuits 114b and 124b of FIG. 6.

Referring to FIG. 6, a transmitter 612 of the first device 110 and a receiver 622 of the second device 120 may be connected to each other through the signal line 130. The first device 110 may include the ODT circuit 114b connected to the signal line 130, and the ODT circuit 114b may be configured as a pull-down circuit connected to the ground voltage VSSQ line. The ODT circuit 114b may include the pull-down resistor RD connected between the ground voltage VSSQ line and the signal line 130 and the pull-down switch SD disposed in correspondence to the pull-down resistor RD. The pull-down switch SD may be turned on or off according to a first ODT control signal C1b. The first ODT control signal C1b may be generated by the ODT control circuit 112. When the pull-down switch SD is turned on by the first ODT control signal C1b, the ODT circuit 114b may be ODT enabled. When the pull-down switch SD is turned off, the ODT circuit 114b may be ODT disabled.

The second device 120 may include the ODT circuit 124b connected to the signal line 130, and the ODT circuit 124b may be configured as a pull-up circuit connected to the power voltage line VDDQ. The ODT circuit 124b may include the pull-up resistor RU connected between the power voltage VDDQ line and the signal line 130 and the pull-up switch SU disposed in correspondence to the pull-up resistor RU. The pull-up switch SU may be turned on or off according to a second ODT control signal C2b. The second ODT control signal C2b may be generated by the control circuit 122. When the pull-up switch SU is turned on by the second ODT control signal C2b, the ODT circuit 124b may be ODT enabled. When the pull-up switch SU is turned off, the ODT circuit 124b may be ODT disabled.

The ODT circuit 114b of the first device 110 is configured as the pull-down circuit connected to the ground voltage VSSQ, whereas the ODT circuit 124b of the second device 120 is configured as the pull-up circuit, and thus the first device 110 may confirm that the signal line 130 is in an asymmetric ODT state through an ODT state check operation.

FIG. 6 shows a state in which when a signal is not transmitted through the signal line 130, the pull-down switch SD and the pull-up switch SU are turned off so that the ODT circuits 114b and 124b of the first and second devices 110 and 120 are disabled. Accordingly, during a signal non-transmission, the signal line 130 may maintain a high-impedance state.

Referring to FIGS. 6 and 7A, the transmitter 612 of the first device 110 may include a pull-up circuit 612U and a pull-down circuit 612D connected to the signal line 130. The pull-up circuit 612U may include the plurality of PMOS transistors P1 to Pn connected to the power voltage line VDDQ and the signal line 130, and arranged in parallel. Each of the PMOS transistors P1 to Pn may be turned on or off according to the pull-up drive code PU[n:1] corresponding thereto.

The pull-down circuit 612D may include a plurality of NMOS transistors N1 to Nn connected between the signal line 130 and the ground voltage VSSQ line, and arranged in parallel. Each of the NMOS transistors N1 to Nn may be turned on or off according to the pull-down drive code PD[n:1] corresponding thereto. The NMOS transistors N1 to Nn corresponding to a bit value "1" of the pull-down drive code PD[n:1] are turned on so that the signal line 130 may be driven at a logic low level.

The transmitter 612 of the first device 110 may transmit a signal through the signal line 130 based on the pull-up drive code (PU[n:1]) and the pull-down drive code (PD[n:1]). The second device 120 may receive a signal transmitted through the signal line 130. When the receiver 622 of the second device 120 receives the signal, the ODT circuit 124b of the second device 120 may provide a termination resistance through the signal line 130. The ODT circuit 124b may include a plurality of PMOS transistors OP1 to OPn connected between the power voltage line VDDQ and the signal line 130, and arranged in parallel. Each of the PMOS transistors OP1 to OPn may be turned on or off according to a second ODT control signal C2b[n:1] of n bits corresponding thereto. The second ODT control signal C2b[n:1] may be generated by the control circuit 122. A resistance value according to an on/off state of each of the PMOS transistors OP1 to OPn may be provided as a termination resistance of the signal line 130.

When the transmitter 612 does not transmit a signal through the signal line 130, the pull-up drive code PU[n:1] and the pull-down drive code PD[n:1] are not provided. In this case, the pull-down circuit 612D may operate as the ODT circuit 114b of the signal line 130. During the signal non-transmission, all of the NMOS transistors N1 to Nn of the pull-down circuit 612U may be turned off according to a first ODT control signal C1b[n:1] of n bits. The first ODT control signal C1b[n:1] may be generated by the ODT control circuit 112. Accordingly, the ODT circuit 114b of the first device 110 may be disabled. Also, all of the PMOS transistors OP1 to OPn of the ODT circuit 124b of the second device 120 may be turned off according to a second ODT control signal C2b[n:1] of n bits. Accordingly, the ODT circuit 124b of the second device 120 may be disabled. During the signal non-transmission, the ODT circuits 114b and 124b of the first and second devices 110 and 120 are disabled, and thus, the signal line 130 may maintain a high-impedance state.

FIG. 7B is different from FIG. 7A in that the second device 120 includes the plurality of NMOS transistors ON1 to ONn connected between the power voltage VDDQ line and the signal line 130, and arranged in parallel. Hereinafter, a redundant description with that of FIG. 7A with respect to the first device 110 will be omitted.

When the receiver 622 of the second device 120 receives a signal through the signal line 130, each of the NMOS transistors ON1 to ONn of the second ODT circuit 124b may be turned on or off according to a second ODT control signal C2b[n:1] of n bits corresponding thereto. A termination resistance value according to the on/off state of the NMOS transistors ON1 to ONn may be provided through the signal line 130.

When no signal is transmitted through the signal line 130, all of the NMOS transistors ON1 to ONn of the second ODT circuit 124b may be turned off according to the second ODT control signal C2b[n:1] of n bits, and the second ODT circuit 124b may be disabled. Also, all of the NMOS transistors N1 to Nn of the pull-down circuit 612U operating as the ODT circuit 114b of the first device 110 may also be turned off according to the first ODT control signal C1b[n:1] of n bits, and the ODT circuit 114b may be disabled. During the non-transmission, the ODT circuits 114b and 124b of the first and second devices 110 and 120 are disabled, and thus, the signal line 130 may maintain a high-impedance state.

Figure 8:
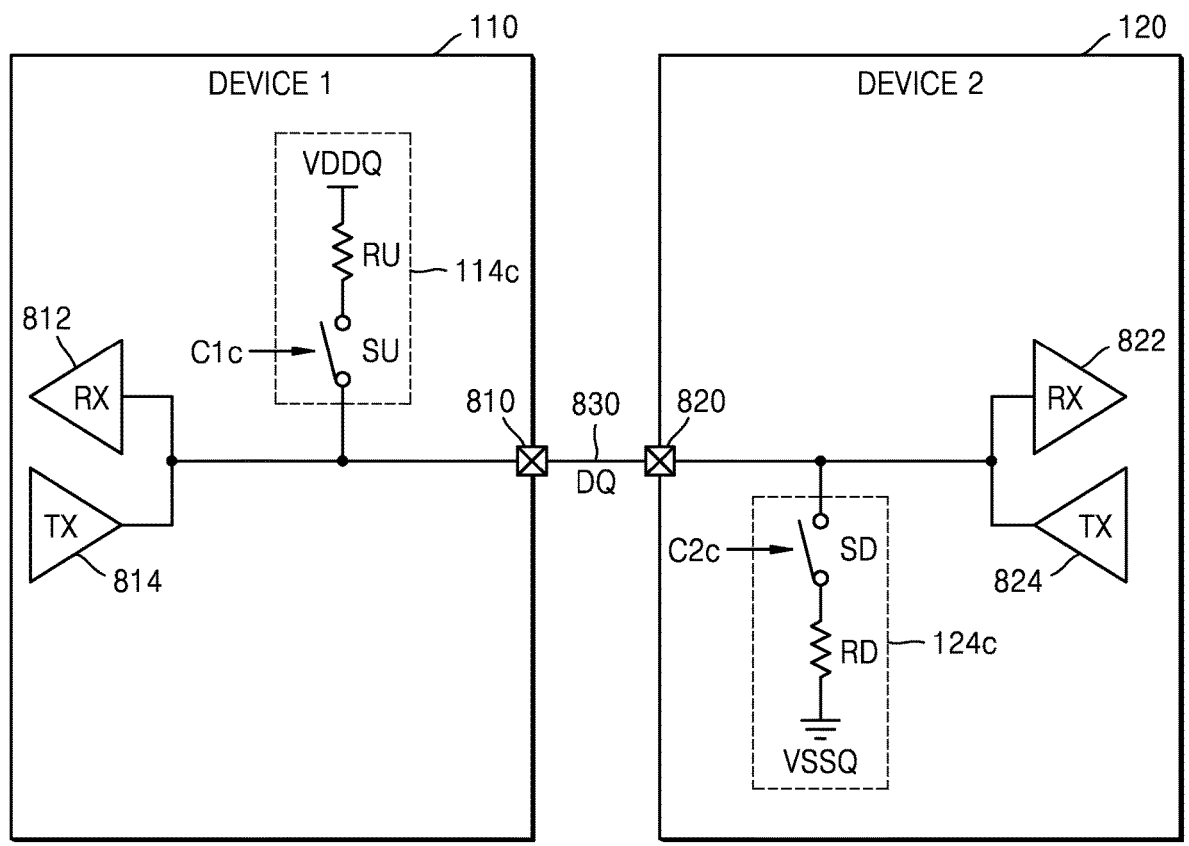
FIG. 8 is a diagram conceptually illustrating the ODT circuits of FIG. 1.
Figure 9A:
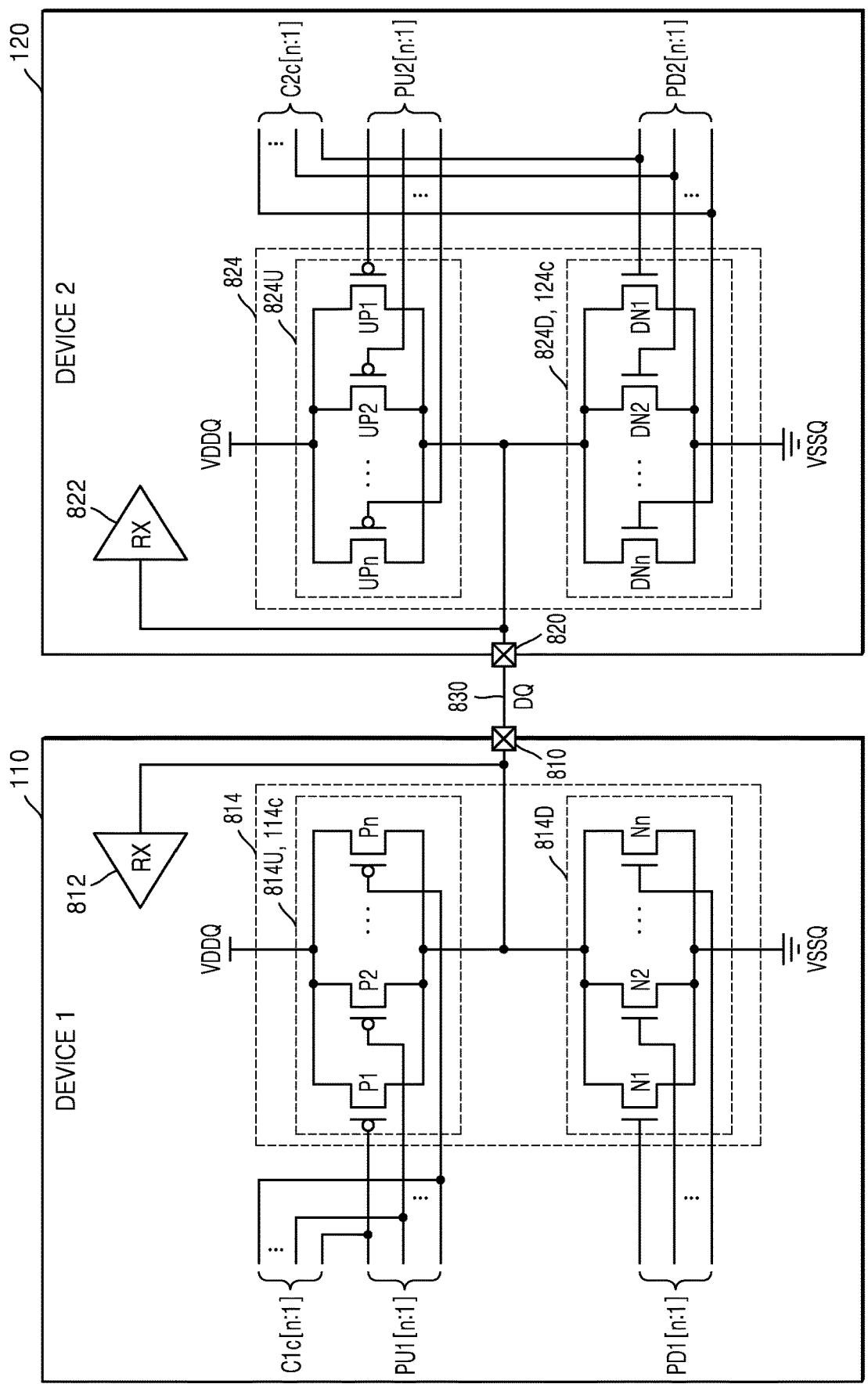
FIGS. 9A and 9B are circuit diagrams illustrating the ODT circuits of FIG. 8.
Figure 9B:
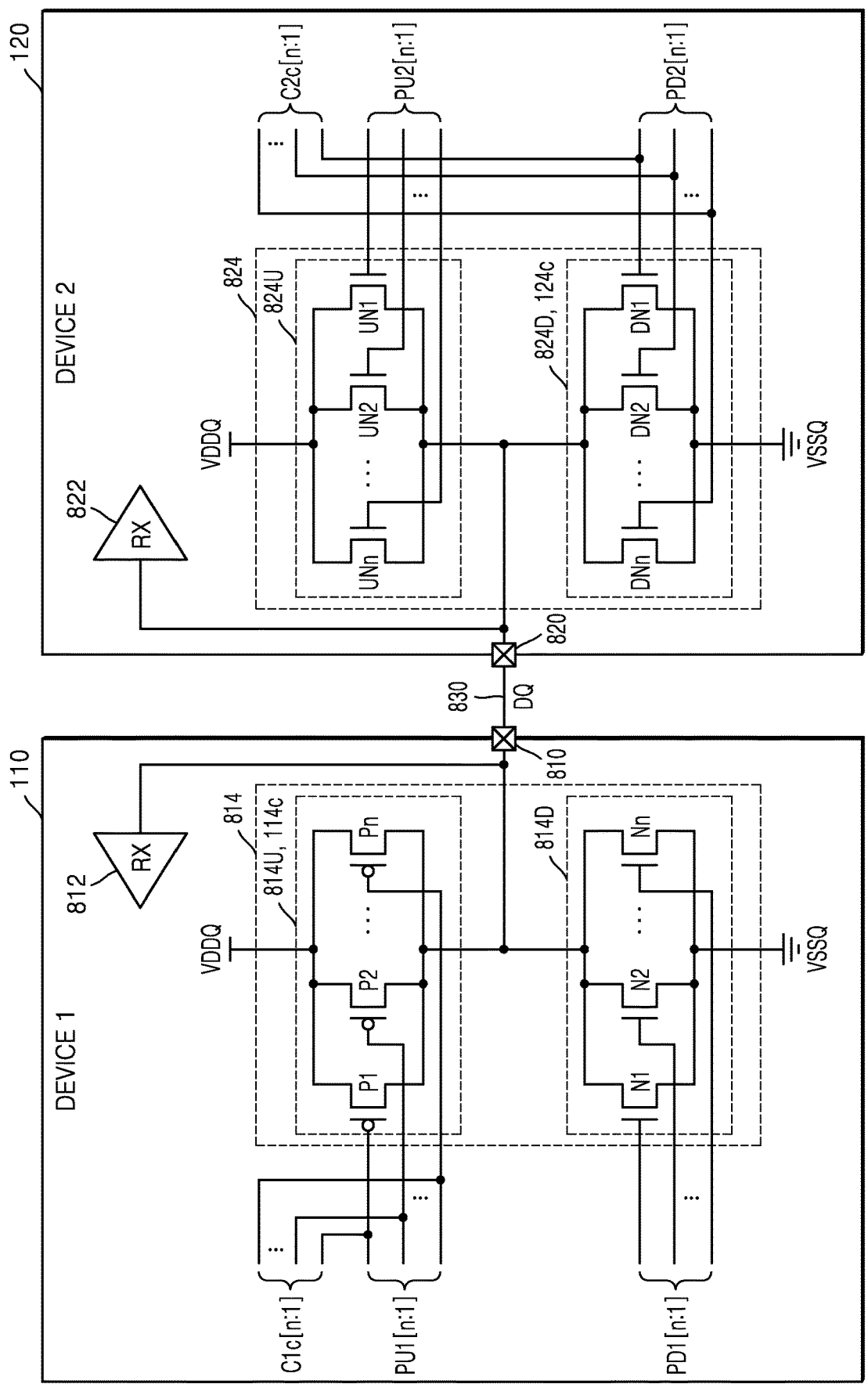

FIG. 8 is a diagram conceptually illustrating ODT circuits 114c and 124c of FIG. 1, and FIGS. 9A and 9B are circuit diagrams illustrating the ODT circuits 114c and 124c of FIG. 8.

Referring to FIG. 8, the first device 110 and the second device 120 may be connected to each other through a data line 830 that transmits the data signal DQ. The first device 110 may transmit/receive a data signal DQ through a first pin 810, and the second device 120 may transmit/receive the data signal DQ through a second pin 820. For example, the data signal DQ may be transmitted through a plurality of data signal lines. In this case, the first pin 810 and the second pin 820 may include a plurality of pins corresponding to the plurality of data signal lines.

The first device 110 may include a receiver 812 that receives the data signal DQ from the second device 120 and a transmitter 814 that transmits the data signal DQ to the second device 120 through the first pin 810. The receiver 812 may function as a data input buffer of the first device 110, and the transmitter 814 may function as a data output buffer of the first device 110.

The first device 110 may include the ODT circuit 114c connected to the first pin 810 and the data line 830, and the ODT circuit 114c may be configured as a pull-up circuit connected to the power voltage VDDQ line. The ODT circuit 114c may include the pull-up resistor RU connected between the power voltage VDDQ line and the data line 830 and the pull-up switch SU disposed in correspondence to the pull-up resistor RU. The pull-up switch SU may be turned on or off according to a first ODT control signal C1c. The first ODT control signal C1c may be generated by the ODT control circuit 112. When the pull-up switch SU is turned on by the first ODT control signal C1c, the ODT circuit 114c may be ODT enabled, and when the pull-up switch SU is turned off, the ODT circuit 114c may be ODT disabled.

The second device 120 may include a receiver 822 that receives the data signal DQ from the first device 110 and a transmitter 824 that transmits the data signal DQ to the first device 110 through the second pin 820. The receiver 822 may function as a data input buffer of the second device 120, and the transmitter 824 may function as a data output buffer of the second device 120.

The second device 120 may include the ODT circuit 124c connected to the second pin 820 and the data line 830, and the ODT circuit 124c may be configured as a pull-down circuit connected to the ground voltage VSSQ line. The ODT circuit 124c may include the pull-down resistor RD connected between the data line 830 and the ground voltage VSSQ line and the pull-down switch SD disposed in correspondence to the pull-down resistor RD. The pull-down switch SD may be turned on or off according to a second ODT control signal C2c. The second ODT control signal C2c may be generated by the control circuit 122. When the pull-down switch SD is turned on by the second ODT control signal C2c, the ODT circuit 124c may be ODT enabled, and when the pull-down switch SD is turned off, the ODT circuit 124c may be ODT disabled.

The ODT circuit 114c of the first device 110 is configured as the pull-up circuit connected to the power voltage VDDQ, whereas the ODT circuit 124c of the second device 120 is configured as the pull-down circuit, and thus the first device 110 may confirm that the data line 830 is in an asymmetric ODT state through an ODT state check operation described with reference to FIG. 4.

FIG. 8 shows a state in which when the data signal DQ is not transmitted to the data line 830, the pull-up switch SU and the pull-down switch SD are turned off so that the ODT circuits 114c and 124c of the first and second devices 110 and 120 are disabled. Accordingly, during the data non-transmission, the data line 830 may maintain a high-impedance state.

Referring to FIGS. 8 and 9A, the transmitter 814 of the first device 110 may include a pull-up circuit 814U and a pull-down circuit 814D connected to the first pin 810 and the data line 830. The pull-up circuit 814U may include the plurality of PMOS transistors P1 to Pn connected to the power voltage line VDDQ and the data line 830, and arranged in parallel. Each of the PMOS transistors P1 to Pn may be turned on or off according to a first pull-up drive code PU1[n:1] corresponding thereto. The PMOS transistors P1 to Pn corresponding to a bit value "0" of the first pull-up drive code PU1[n:1] are turned on so that the data line 830 may be driven at a logic high level. As additional transistors of the PMOS transistors P1 to Pn are turned on, the driving capability of the pull-up circuit 814U may be increased.

The pull-down circuit 814D may include the plurality of NMOS transistors N1 to Nn connected between the data line 830 and the ground voltage VSSQ line, and arranged in parallel. Each of the NMOS transistors N1 to Nn may be turned on or off according to a first pull-down drive code PD1[n:1] corresponding thereto. The NMOS transistors N1 to Nn corresponding to a bit value "1" of the first pull-down drive code PD1[n:1] are turned on so that the data line 830 may be driven at a logic low level. As additional transistors of the NMOS transistors N1 to Nn are turned on, the driving capability of the pull-down circuit 814D may be increased.

The transmitter 814 of the first device 110 may transmit the data signal DQ through the data line 830 based on the first pull-up drive code PU1[n:1] and the first pull-down drive code PD1[n:1]. FIG. 9A shows that the pull-up circuit 814U includes PMOS transistors and the pull-down circuit 814D includes NMOS transistors, but example embodiments are not limited thereto. As an example, each of the pull-up circuit 814U and the pull-down circuit 814D may include NMOS transistors or PMOS transistors. As another example, each of the pull-up circuit 814U and the pull-down circuit 814D may include both NMOS transistors and PMOS transistors.

The first device 110 may receive the data signal DQ transmitted through the data line 830 via the first pin 810. At this time, the first pull-up drive code PU1[n:1] and the first pull-down drive code PD1[n:1] are not provided. When the receiver 812 of the first device 110 receives the data signal DQ, the transmitter 814 of the first device 110 may provide a termination resistance through the data line 830. The pull-up circuit 814U of the transmitter 814 may operate as the ODT circuit 114c of the data line 830. Each of the PMOS transistors P1 to Pn of the pull-up circuit 814U may be turned on or off according to a first ODT control signal C1c[n:1] of n bits corresponding thereto. The first ODT control signal C1c[n:1] may be generated by the ODT control circuit 112. A termination resistance value according to an on/off state of the PMOS transistors P1 to Pn may be provided through the data line 830.

The transmitter 824 of the second device 120 may include a pull-up circuit 824U and a pull-down circuit 824D coupled to the data line 830 and the second pin 820. The pull-up circuit 824U may include a plurality of PMOS transistors UP1 to UPn connected to the power voltage VDDQ line and the data line 830, and arranged in parallel. Each of the PMOS transistors UP1 to UPn may be turned on or off according to a second pull-up drive code PU2[n:1] corresponding thereto. The PMOS transistors UP1 to UPn corresponding to a bit value "0" of the second pull-up drive code PU2[n:1] are turned on so that the data line 830 may be driven at a logic high level. As additional transistors of the PMOS transistors UP1 to UPn are turned on, the driving capability of the pull-up circuit 824U may be increased.

The pull-down circuit 824D may include a plurality of NMOS transistors DN1 to DNn connected between the data line 830 and the ground voltage VSSQ line, and arranged in parallel. Each of the NMOS transistors DN1 to DNn may be turned on or off according to a second pull-down drive code PD2[n:1] corresponding thereto. The NMOS transistors DN1 to DNn corresponding to a bit value "1" of the second pull-down drive code PD2 [n:1] are turned on so that the data line 830 may be driven at a logic low level. As additional transistors of the NMOS transistors DN1 to DNn are turned on, the driving capability of the pull-down circuit 824D may be increased.

The transmitter 824 of the second device 120 may transmit the data signal DQ through the data line 830 based on the second pull-up drive code PU2[n:1] and the second pull-down drive code PD2[n:1]. FIG. 9A shows that the pull-up circuit 824U includes PMOS transistors and the pull-down circuit 824D includes NMOS transistors, but example embodiments are not limited thereto. As an example, each of the pull-up circuit 824U and the pull-down circuit 824D may include NMOS transistors or PMOS transistors. As another example, each of the pull-up circuit 824U and the pull-down circuit 824D may include both NMOS transistors and PMOS transistors.

The second device 120 may receive the data signal DQ transmitted through the data line 830 via the second pin 820. At this time, the second pull-up drive code PU2[n:1] and the second pull-down drive code PD2[n:1] are not provided. When the receiver 822 of the second device 120 receives the data signal DQ, the transmitter 824 of the second device 120 may provide a termination resistance through the data line 830. The pull-down circuit 824D of the transmitter 824 may operate as the ODT circuit 124c of the data line 830. Each of the NMOS transistors DN1 to DNn of the pull-down circuit 824D may be turned on or off according to a second ODT control signal C2c[n:1] of n bits corresponding thereto. The second ODT control signal C2c[n:1] may be generated by the control circuit 122. A termination resistance according to an on/off state of the NMOS transistors DN1 to DNn may be provided through the data line 830.

When the data signal DQ is not transmitted to the data line 830, all of the PMOS transistors P1 to Pn of the pull-up circuit 814U of the first device 110 may be turned off according to the first ODT control signal C1c[n:1] of n bits. Accordingly, the ODT circuit 114c of the first device 110 may be disabled. In addition, all of the NMOS transistors DN1 to DNn of the pull-down circuit 824D of the ODT circuit 124c of the second device 120 may be also turned off according to the second ODT control signal C2c[n:1] of n bits. Accordingly, the ODT circuit 124c of the second device 120 may be disabled. During the non-transmission, the ODT circuits 114c and 124c of the first and second devices 110 and 120 are disabled, and thus, the data line 830 may maintain a high-impedance state.

FIGS. 8 and 9B are different from FIG. 9A in that the pull-up circuit 824U of the second device 120 includes the plurality of NMOS transistors UN1 to UNn connected to the power voltage VDDQ line and the data line 830, and arranged in parallel. Hereinafter, redundant descriptions with those of FIG. 9A with respect to the first and second devices 110 and 120 will be omitted.

When the data signal DQ is not transmitted through the data line 830, all of the PMOS transistors P1 to Pn of the pull-up circuit 814U operating as the ODT circuit 114c of the first device 110 may be turned off according to the first ODT control signal C1c[n:1] of n bits, and the first ODT circuit 114c may be disabled. All of the NMOS transistors UN1 to UNn of the pull-up circuit 824U operating as the ODT circuit 124c of the second device 120 may be also turned off according to the second ODT control signal C2c[n:1] of n bits, and the ODT circuit 124c may be disabled. Accordingly, during the data non-transmission, the ODT circuits 114c and 124c of the first and second devices 110 and 120 are disabled, and thus, the data line 830 may maintain a high-impedance state.

Figure 10:
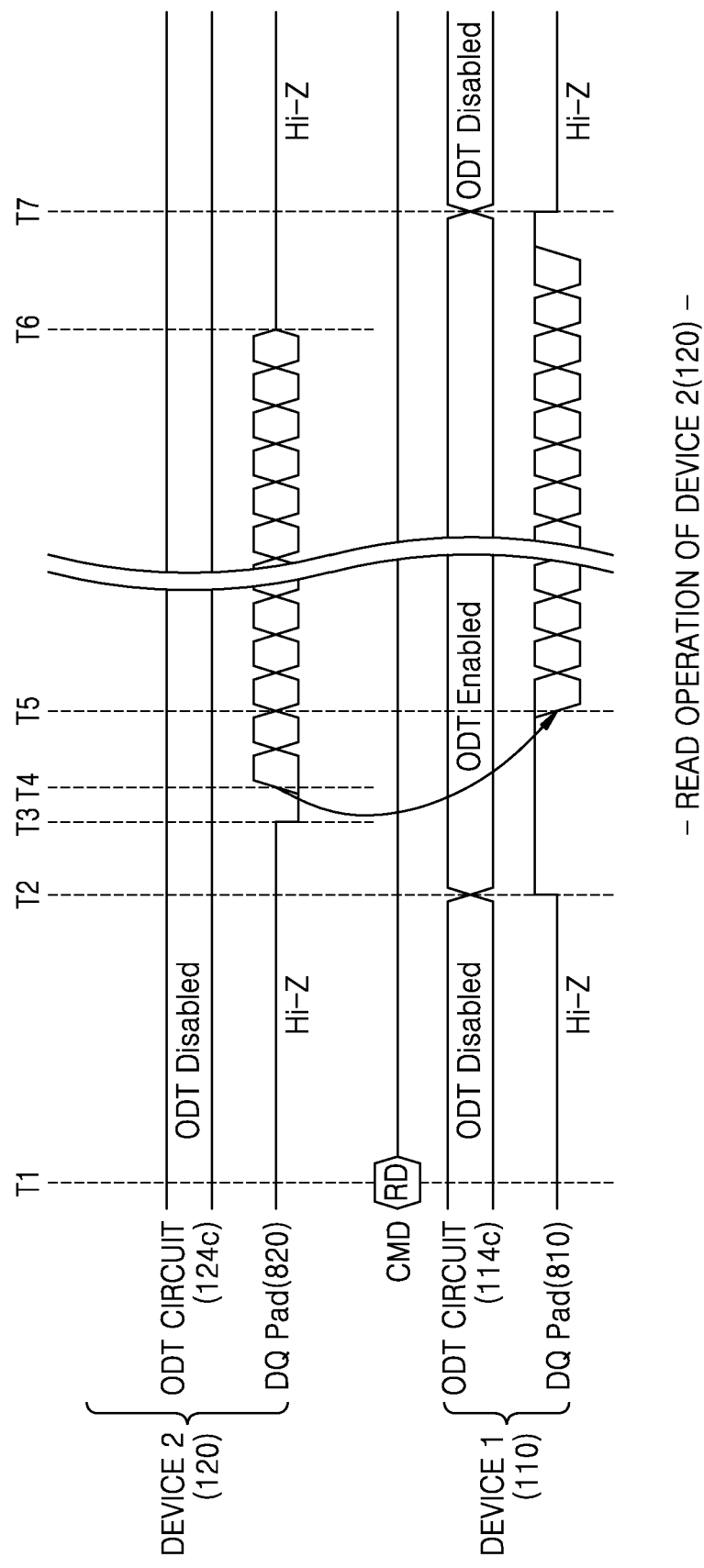
FIGS. 10 and 11 are diagrams illustrating an operation of a second apparatus associated with the ODT circuits of FIG. 8.
Figure 11:
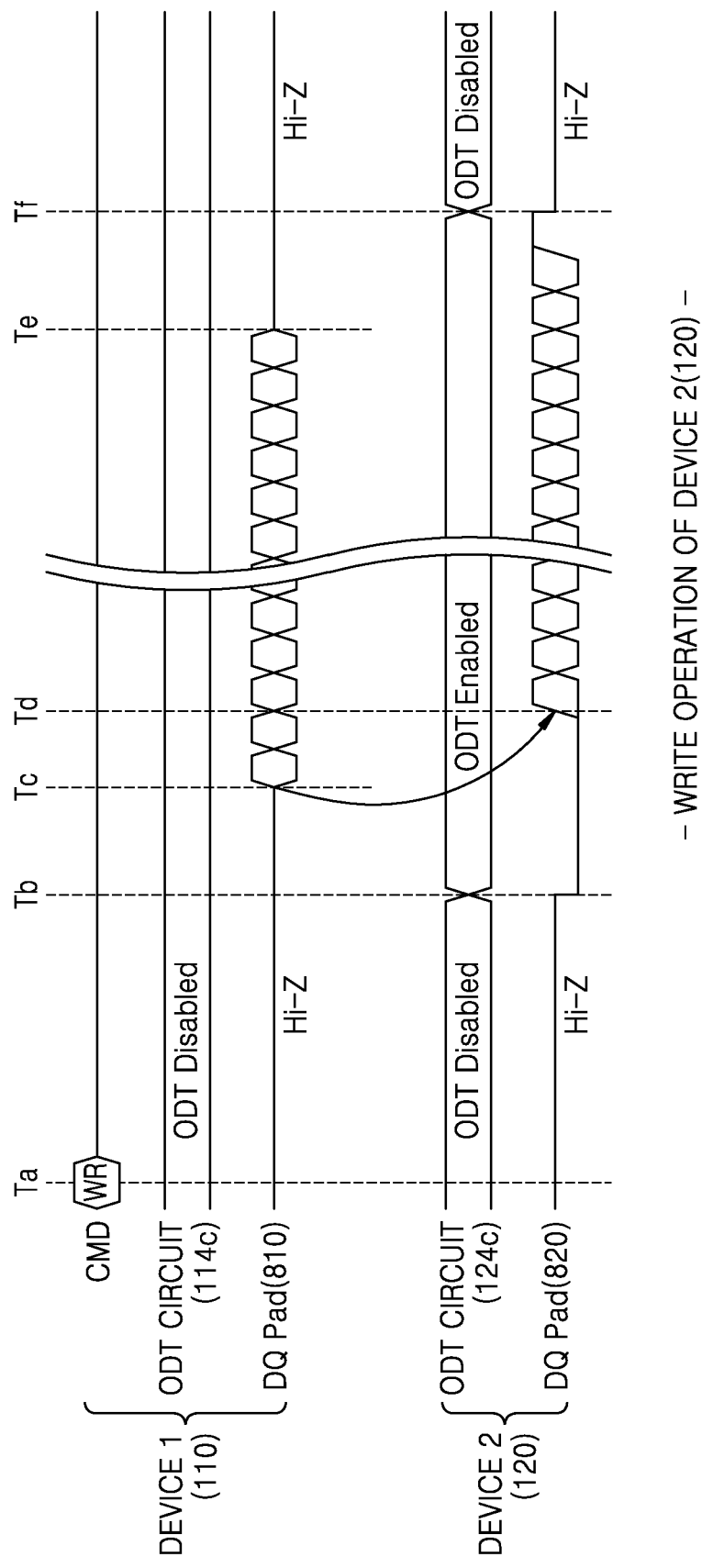

FIGS. 10 and 11 are diagrams illustrating an operation of the second device 120 associated with the ODT circuits 114c and 124c of FIG. 8. FIG. 10 illustrates a read operation on the second device 120, and FIG. 11 illustrates a write operation on the second device 120. It should be noted that the horizontal axis and the vertical axis in the timing diagrams illustrated in FIGS. 10 and 11, respectively, represent time and voltage levels, and are not necessarily shown in a constant ratio.

Referring to FIGS. 1, 8, and 10, at a time T1, the first device 110 may issue a read command RD for a read operation on the second device 120 and provide the read command RD to the second device 120 through the signal line 130 (FIG. 1). The second device 120 may receive the read command RD, and the control circuit 122 may generate control signals for performing various memory operations in the second device 120 according to the read command RD. At this time, the ODT circuits 114c and 124c of the first and second devices 110 and 120 are in a disabled state. Accordingly, the first pin 810 of the first device 110 and the second pin 820 of the second device 120 may be set to a high-impedance state Hi-Z. Before the data signal DQ according to the read command RD is transmitted to the data line 830, the data line 830 between the first pin 810 and the second pin 820 may be maintained in the high-impedance state Hi-Z.

At a time T2, the first device 110 may enable the ODT circuit 114c to receive the data signal DQ according to the read command RD from the second device 120. Accordingly, the first pin 810 of the first device 110 may be changed from the high-impedance state Hi-Z to, for example, the power voltage VDDQ level, and the ODT circuit 114c may provide a termination resistance.

From a time T3 to a time T4, before outputting the data signal DQ according to the read command RD to the second pin 820, the second device 120 may pre-drive the data signal DQ, for example, having a logic low level during a period corresponding to a read preamble length.

From the time T4 to a time T6, the second device 120 may transmit the data signal DQ according to the read command RD through the second pin 820 and the data line 830. At a time T5, the first device 110 may receive the data signal DQ of the second device 120 transmitted through the data line 830 via the first pin 810.

At the time T6, the second device 120 may complete transmission of the data signal DQ according to the read command RD. The second pin 820 may be changed to the high-impedance state Hi-Z by disabling the ODT circuit 124c of the second device 120.

At a time T7, the first device 110 may complete reception of the data signal DQ according to the read command RD from the second device 120 and may disable the ODT circuit 114c. The first pin 810 of the first device 110 may be changed to the high-impedance state Hi-Z. When the transmission of the data signal DQ according to the read command RD is completed, the data line 830 between the first pin 810 and the second pin 820 may maintain the high-impedance state Hi-Z.

Referring to FIGS. 1, 8, and 11, at a time Ta, the first device 110 may issue a write command WR for a write operation on the second device 120 and provide the write command WR to the second device 120 through the signal line 130 (FIG. 1). The second device 120 may receive the write command WR, and the control circuit 122 may generate control signals for performing various memory operations in the second device 120 according to the write command WR. At this time, the ODT circuits 114c and 124c of the first and second devices 110 and 120 are in a disabled state. Accordingly, the first pin 810 of the first device 110 and the second pin 820 of the second device 120 may be set to the high-impedance state Hi-Z. Before the data signal DQ according to the write command WR is transmitted to the data line 830, the data line 830 between the first pin 810 and the second pin 820 may be maintained in the high-impedance state Hi-Z.

At a time Tb, the second device 120 may enable the ODT circuit 124c to receive the data signal DQ according to the write command WR from the first device 110. Accordingly, the second pin 820 of the second device 120 may be changed from the high-impedance state Hi-Z to, for example, the ground voltage VSSQ level, and the ODT circuit 124c may provide a termination resistance.

At a time Tc, the first device 110 may transmit the data signal DQ according to the write command WR to the first pin 810 and the data line 830. At a time Td, the second device 120 may receive the data signal DQ of the first device 110 transmitted through the data line 830 via the second pin 820.

At a time Te, the first device 110 may complete transmission of the data signal DQ according to the write command WR. The first pin 810 may be changed to the high-impedance state Hi-Z by disabling the ODT circuit 114c of the first device 110.

At a time Tf, the second device 120 may complete reception of the data signal DQ according to the write command WR from the first device 110 and may disable the ODT circuit 124c. The second pin 820 of the second device 120 may be changed to the high-impedance state Hi-Z. When transmission of the data signal DQ according to the write command WR is completed, the data line 830 between the first pin 810 and the second pin 820 may maintain the high-impedance state Hi-Z.

Figure 12:
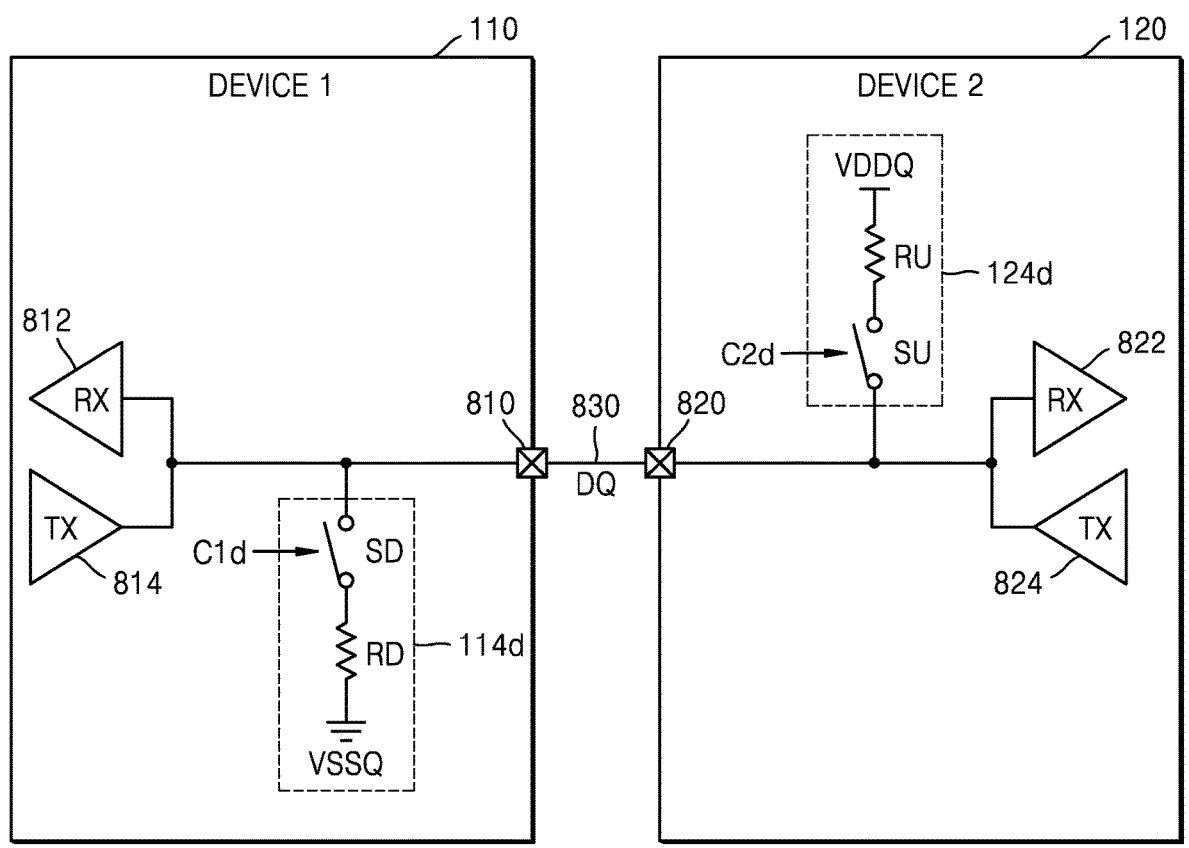
FIG. 12 is a diagram conceptually illustrating the ODT circuits of FIG. 1.
Figure 13:
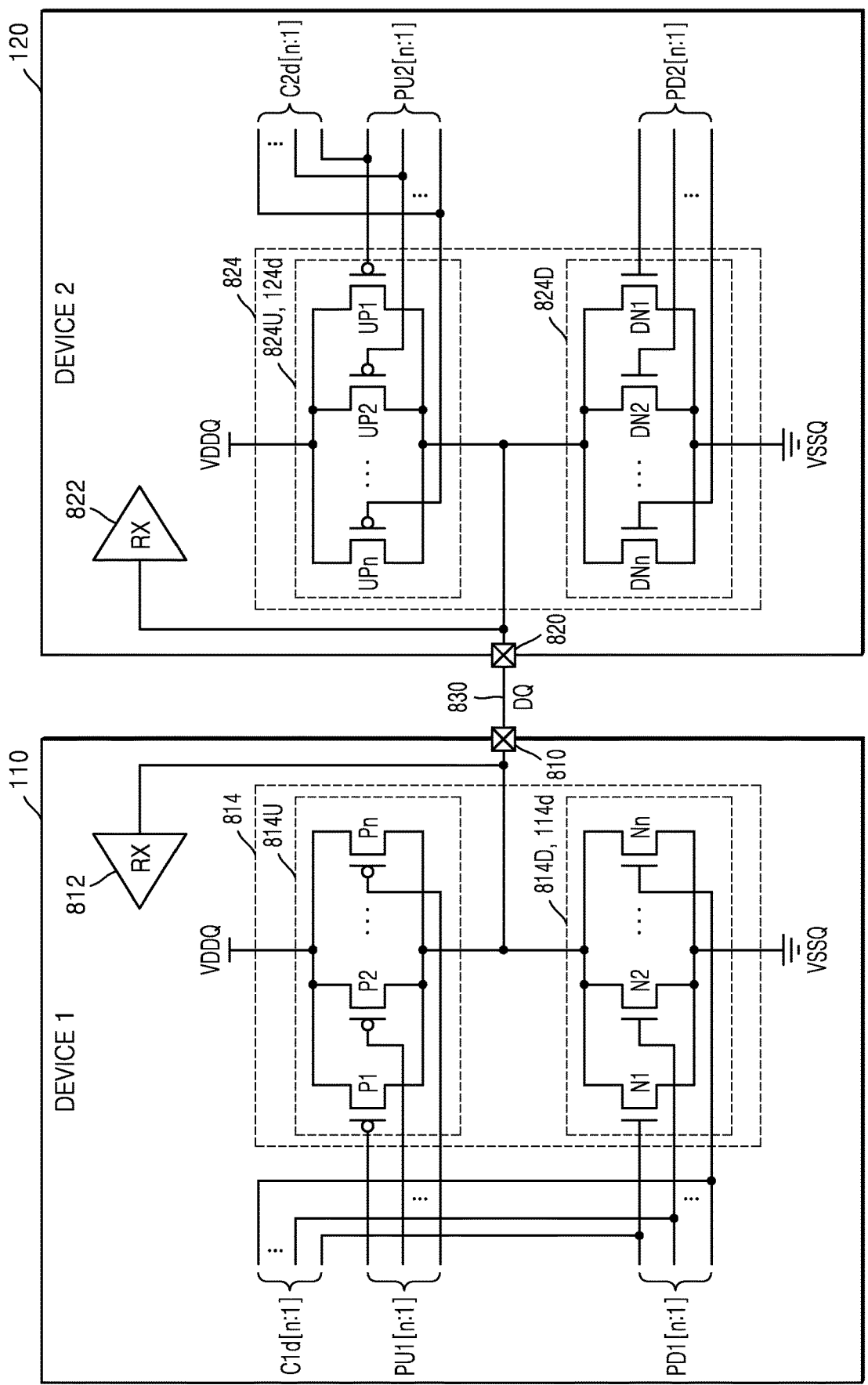
FIG. 13 is a circuit diagram illustrating the ODT circuits of FIG. 12.

FIG. 12 is a diagram conceptually illustrating the ODT circuits 114d and 124d of FIG. 1, and FIG. 13 is a circuit diagram illustrating the ODT circuits 114d and 124d of FIG. 12. FIG. 12 is different from FIG. 8 in that the ODT circuit 114d of the first device 110 is configured as a pull-down circuit connected to the ground voltage VSSQ line and the ODT circuit 124d of the second device 120 is configured as a pull-up circuit connected to the power voltage VDDQ line. Hereinafter, descriptions redundant with those of FIGS. 8 and 9A with respect to the first and second devices 110 and 120 will be omitted.

Referring to FIG. 12, the ODT circuit 114d of the first device 110 may include the pull-down resistor RD connected between the data line 830 and the ground voltage VSSQ line and the pull-down switch SD disposed in correspondence to the pull-down resistor RD. The pull-down switch SD may be turned on or off according to a first ODT control signal C1d. The first ODT control signal C1d may be generated by the ODT control circuit 112. When the pull-down switch SD is turned on by the first ODT control signal C1d, the ODT circuit 114d may be ODT enabled, and when the pull-down switch SD is turned off, the ODT circuit 114d may be ODT disabled.

The ODT circuit 124d of the second device 120 may include the pull-up resistor RU connected between the power voltage VDDQ line and the data line 830 and the pull-up switch SU disposed in correspondence to the pull-up resistor RU. The pull-up switch SU may be turned on or off according to a second ODT control signal C2d. The second ODT control signal C2d may be generated by the control circuit 122. When the pull-up switch SU is turned on by the second ODT control signal C2d, the ODT circuit 124d may be ODT enabled. When the pull-up switch SU is turned off, the ODT circuit 124d may be ODT disabled.

The ODT circuit 114d of the first device 110 is configured as a pull-down circuit connected to the ground voltage VSSQ line, whereas the ODT circuit 124d of the second device 120 is configured as a pull-up circuit connected to the power voltage VDDQ, and thus the first device 110 may confirm that the data line 830 is in an asymmetric ODT state through an ODT state check operation described with reference to FIG. 4.

FIG. 12 shows a state in which when the data signal DQ is not transmitted through the data line 830, the pull-up switch SU and the pull-down switch SD are turned off so that the ODT circuits 114d and 124d of the first and second devices 110 and 120 are disabled. Accordingly, during a data non-transmission, the data line 830 may maintain a high-impedance state.

Referring to FIGS. 12 and 13, the transmitter 814 of the first device 110 may generate the data signal DQ based on the first pull-up drive code PU1[n:1] and the second pull-down drive code PD1[n:1], and transmit the data signal DQ to the second device 120 through the data line 830. The receiver 822 of the second device 120 may receive the data signal DQ through the second pin 820. When the receiver 822 of the second device 120 receives the data signal DQ, the transmitter 824 of the second device 120 may provide a termination resistance through the data line 830. The pull-up circuit 824U of the transmitter 824 may operate as the ODT circuit 124d of the data line 830. Each of the PMOS transistors UP1 to UPn of the pull-up circuit 824U may be turned on or off according to a second ODT control signal C2d[n:1] of n bits corresponding thereto. The second ODT control signal C2d[n:1] may be generated by the control circuit 122. A termination resistance value according to an on/off state of the PMOS transistors UP1 to UPn may be provided through the data line 830.

The transmitter 824 of the second device 120 may generate the data signal DQ based on the second pull-up drive code PU2[n:1] and the second pull-down drive code PD2[n:1] and transmit the data signal DQ to the first device 110 through the data line 830. The receiver 812 of the first device 110 may receive the data signal DQ through the first pin 810. When the receiver 812 of the first device 110 receives the data signal DQ, the transmitter 814 of the first device 110 may provide a termination resistance through the data line 830. The pull-down circuit 814D of the transmitter 814 may operate as the ODT circuit 114d of the data line 830. Each of the NMOS transistors N1 to Nn of the pull-down circuit 814D may be turned on or off according to a first ODT control signal C1d[n:1] of n bits corresponding thereto. The first ODT control signal C1d[n:1] may be generated by the ODT control circuit 112. A termination resistance value according to an on/off state of the NMOS transistors N1 to Nn may be provided through the data line 830.

When the data signal DQ is not transmitted through the data line 830 between the first device 110 and the second device 120, all of the NMOS transistors N1 to Nn of the transmitter 814 of the first device 110 may be turned off according to the first ODT control signal C1d[n:1] of n bits. Accordingly, the ODT circuit 114d of the first device 110 may be disabled. In addition, all of the PMOS transistors UP1 to UPn of the pull-up circuit 824U of the transmitter 824 of the second device 120 may also be turned off according to the second ODT control signal C2d[n:1] of n bits. Accordingly, the ODT circuit 124d of the second device 120 may also be disabled. During the data non-transmission, the ODT circuits 114d and 124d of the first and second devices 110 and 120 are disabled, and thus, the data line 830 may maintain a high-impedance state.

Figure 14:
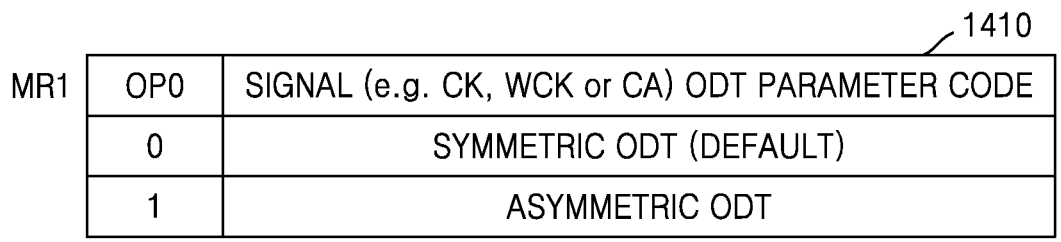
FIG. 14 is a diagram illustrating a part of a mode register set (MRS) according to example embodiments.
Figure 14:
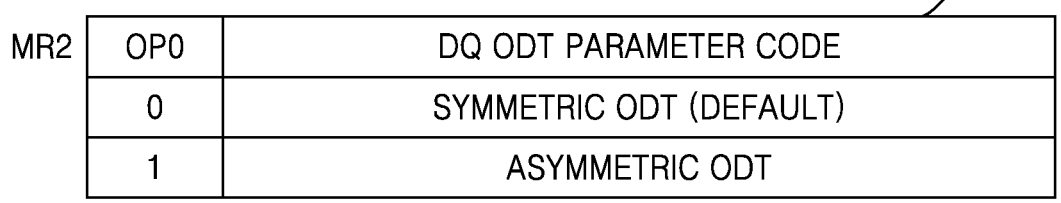

FIG. 14 is a diagram illustrating a part of the MRS 121 according to example embodiments.

Referring to FIGS. 1, 8, and 14, the MRS 121 may include a first mode register 1410 and a second mode register 1420. The first and second mode registers 1410 and 1420 may be identified by respective mode register addresses. The first mode register 1410 may be identified by a first mode register address MR1, and the second mode register 1420 may be identified by a second mode register address MR2. Each of the first and second mode registers 1410 and 1420 may store an ODT parameter code.

The first mode register 1410 may store the ODT parameter code with respect to a signal (e.g., the clock signal CK or a clock signal WCK or the command/address signal CA) based on setting of an OP0 register. The first mode register 1410 may indicate whether the signal is in a symmetric ODT state or an asymmetric ODT state by the setting of the OP0 register.

The second mode register 1420 may store the ODT parameter code with respect to the data signal DQ based on setting of an OP1 register. The second mode register 1420 may indicate whether the data signal DQ is in the symmetric ODT state or the asymmetric ODT state by the setting of the OP1 register.

Figure 15:
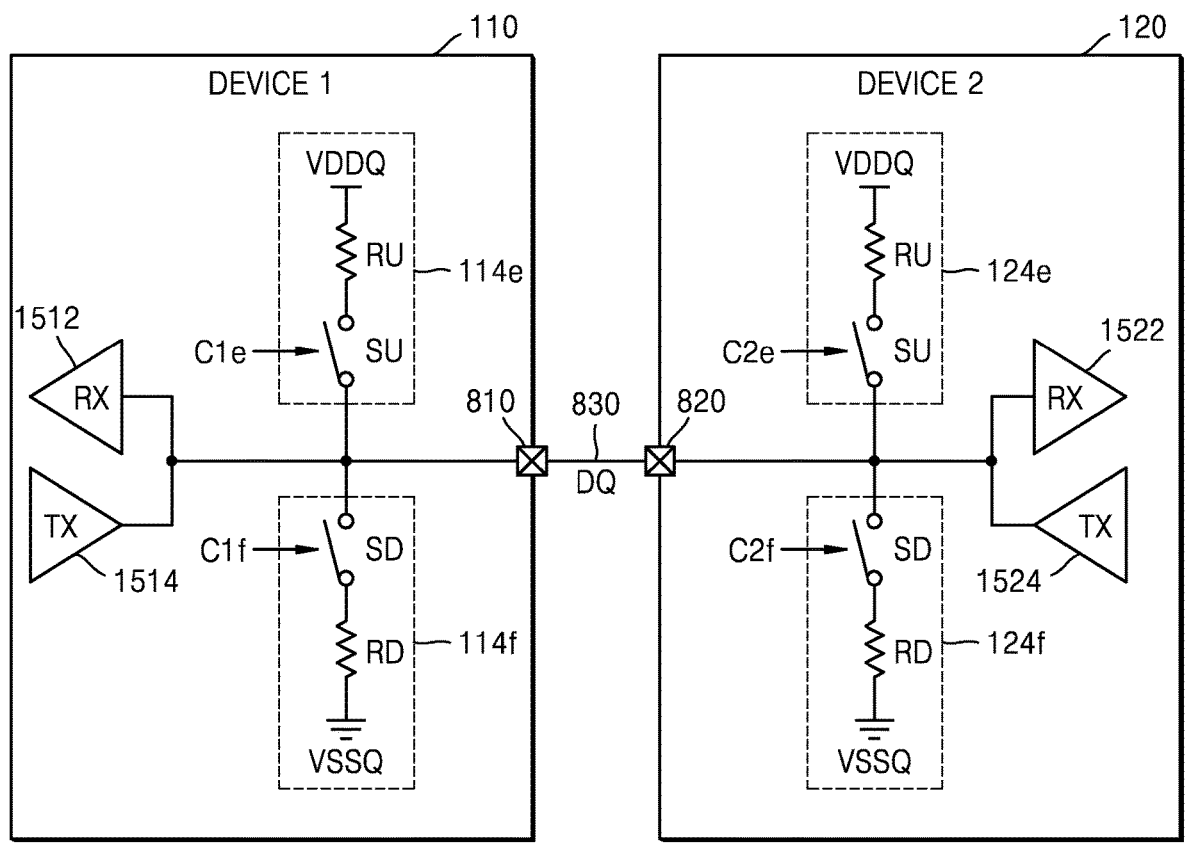
FIG. 15 is a diagram conceptually illustrating the ODT circuits of FIG. 1.
Figure 16:
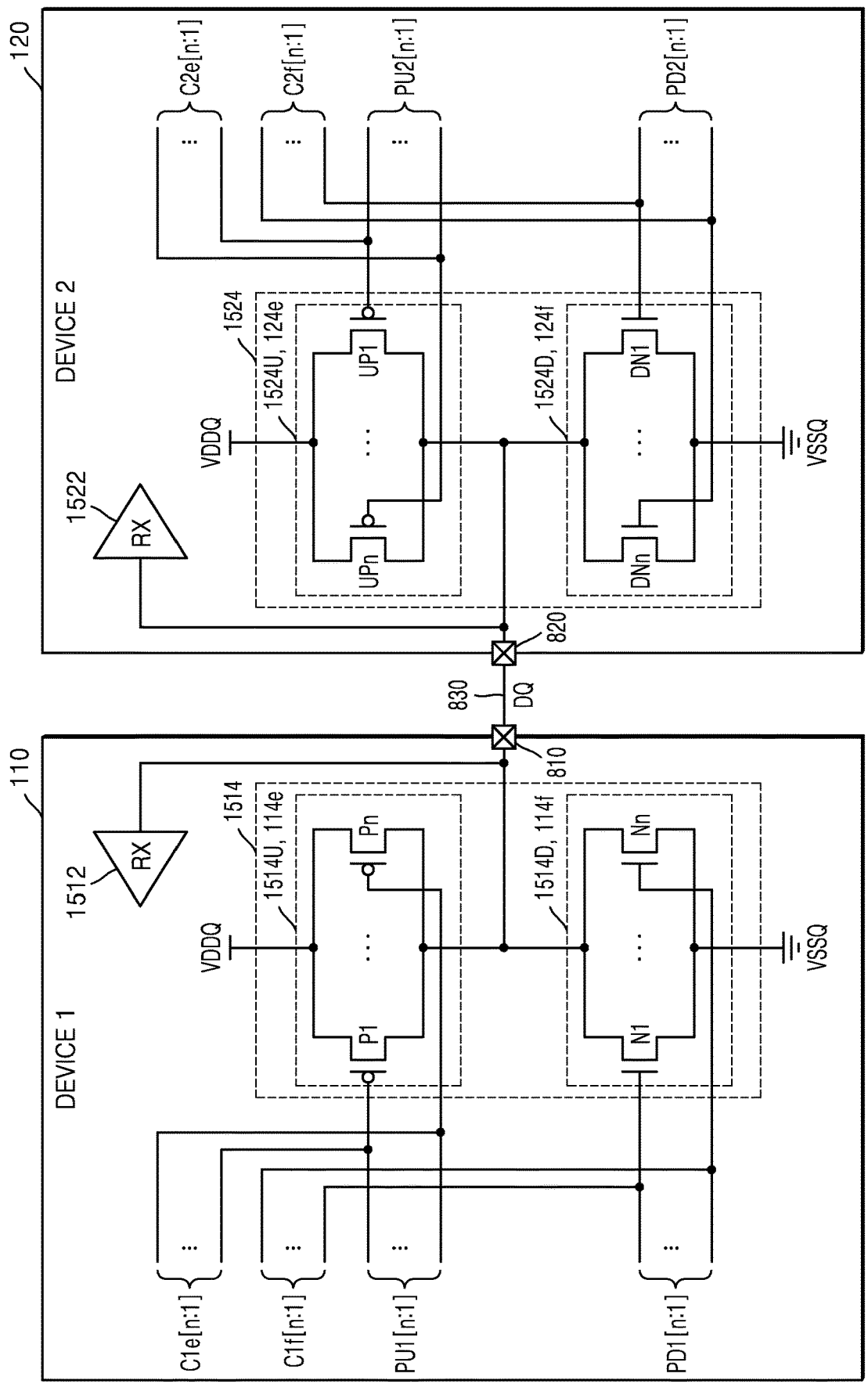
FIG. 16 is a circuit diagram illustrating the ODT circuits of FIG. 15.

FIG. 15 is a diagram conceptually illustrating first to fourth ODT circuits 114e, 114f, 124e, and 124f of FIG. 1, and FIG. 16 is a circuit diagram illustrating the first to fourth ODT circuits 114e, 114f, 124e, and 124f of FIG. 15. FIG. 15 is different from FIG. 8 in that the first device 110 includes the first ODT circuit 114e connected to the power voltage VDDQ and the second ODT circuit 114f connected to the ground voltage line VSSQ, and the second device 120 includes the third ODT circuit 124e connected to the power voltage VDDQ and the fourth ODT circuit 124f connected to the ground voltage VSSQ line.

Referring to FIG. 15, the first and second ODT circuits 114e and 114f of the first device 110 may selectively use a pull-up circuit connected to the power voltage VDDQ and a pull-down circuit connected to the ground voltage VSSQ line. The third and fourth ODT circuits 124e and 124f of the second device 120 may selectively use the pull-up circuit connected to the power voltage VDDQ and the pull-down circuit connected to the ground voltage VSSQ line.

When an ODT parameter code with respect to the data signal DQ set in the MRS 121 of FIG. 14 is in an default symmetric ODT state, the first ODT circuit 114e of the first device 110 and the second ODT circuit 124e of the second device 120 may be selected and terminated at the same voltage, for example, the power voltage VDDQ. Alternatively, the second ODT circuit 114f of the first device 110 and the fourth ODT circuit 124f of the second device 120 may be selected and terminated at the same voltage, for example, the ground voltage VSSQ.

When the ODT parameter code with respect to the data signal DQ set in the MRS 121 of FIG. 14 is in an asymmetric ODT state, the first ODT circuit 114e of the first device 110 and the fourth ODT circuit 124f of the second device 120 may be selected and terminated at different voltages. Alternatively, the second ODT circuit 114f of the first device 110 and the third ODT circuit 124e of the second device 120 may be selected and terminated at different voltages.

Referring to FIGS. 15 and 16, a transmitter 1514 of the first device 110 may generate the data signal DQ based on the first pull-up drive code PU1[n:1] and the first pull-down drive code PD1[n:1]], and transmit the data signal DQ to the second device 120 through the data line 830. A receiver 1522 of the second device 120 may receive the data signal DQ through the second pin 820. When the receiver 1522 of the second device 120 receives the data signal DQ, the transmitter 1524 of the second device 120 may provide a termination resistance through the data line 830.

In the transmitter 1524 of the second device 120, a pull-up circuit 1524U may operate as the third ODT circuit 124e of the second device 120. Each of the PMOS transistors UP1 to UPn of the pull-up circuit 1524U may be turned on or off according to an ODT control signal C2e[n:1] of n bits corresponding thereto. The second ODT control signal C2e[n:1] may be generated by the control circuit 122. A termination resistance value according to an on/off state of the PMOS transistors UP1 to UPn may be provided through the signal line 130. A pull-down circuit 1524D may operate as the fourth ODT circuit 124f of the second device 120. Each of the NMOS transistors DN1 to DNn of the pull-down circuit 1524D may be turned on or off according to an ODT control signal C2f[n:1] of n bits corresponding thereto. The second ODT control signal C2f[n:1] may be generated by the control circuit 122. A termination resistance value according to an on/off state of the NMOS transistors DN1 to DNn may be provided through the signal line 130.

The transmitter 1524 of the second device 120 may generate the data signal DQ based on the second pull-up drive code PU2[n:1] and the second pull-down drive code PD2[n:1] and transmit the data signal DQ to the first device 110 through the data line 830. The receiver 1512 of the first device 110 may receive the data signal DQ through the first pin 810. When the receiver 1512 of the first device 110 receives the data signal DQ, the transmitter 1514 of the first device 110 may provide a termination resistance through the data line 830.

In the transmitter 1514 of the first device 110, a pull-up circuit 1514U may operate as the first ODT circuit 114e of the first device 110. Each of the PMOS transistors P1 to Pn of the pull-up circuit 1521U may be turned on or off according to an ODT control signal C1e[n:1] of n bits corresponding thereto. The ODT control signal C1e[n:1] may be generated by the ODT control circuit 112. A termination resistance value according to the on/off state of the PMOS transistors P1 to Pn may be provided through the signal line 130. The pull-down circuit 1514D may operate as the second ODT circuit 114f of the first device 110. Each of the NMOS transistors N1 to Nn of the pull-down circuit 1514D may be turned on or off according to an ODT control signal C1f[n:1] of n bits corresponding thereto. The ODT control signal C1f[n:1] may be generated by the ODT control circuit 112. A termination resistance value according to the on/off state of the NMOS transistors N1 to Nn may be provided through the signal line 130.

Figure 17:
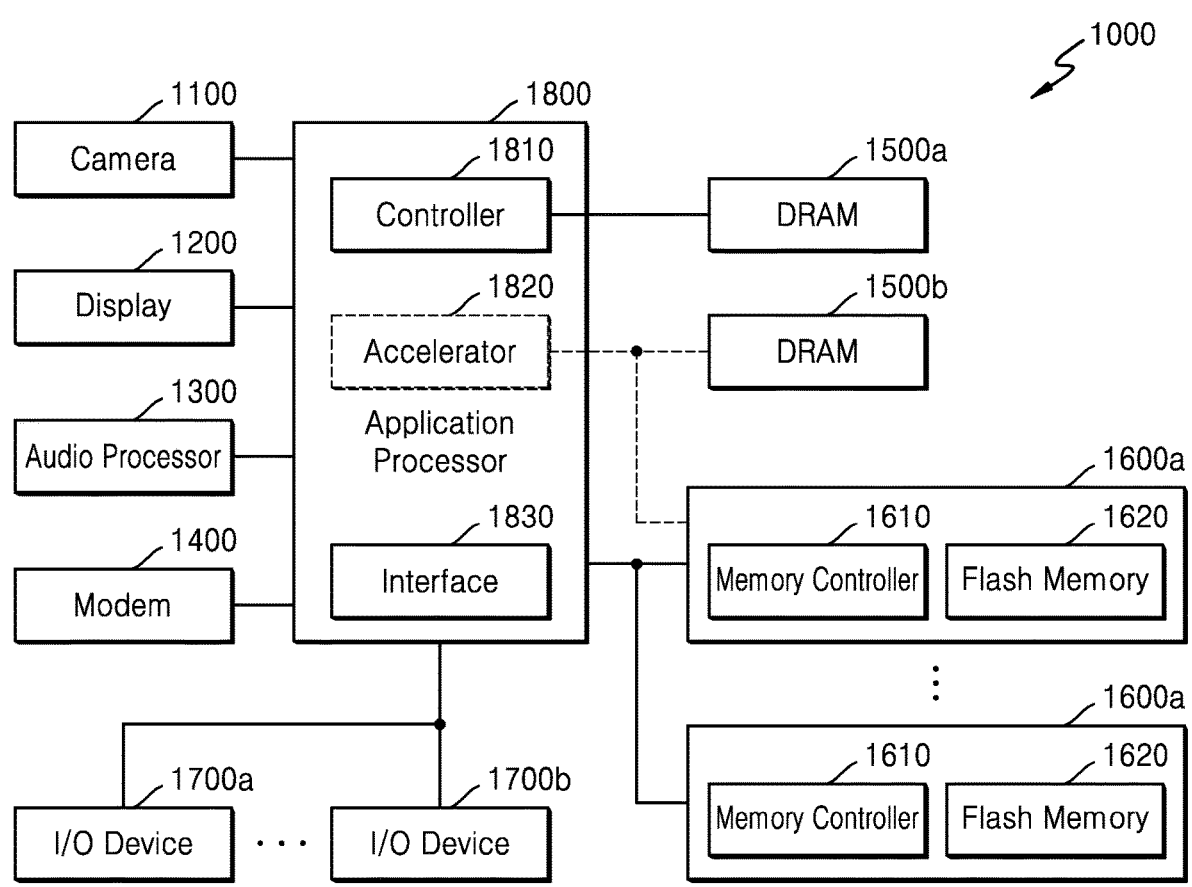
FIG. 17 is a block diagram illustrating a system to which an asymmetric ODT circuit is applied according to example embodiments.

FIG. 17 is a block diagram illustrating a system 1000 to which an asymmetric ODT circuit is applied according to example embodiments.

Referring to FIG. 17, the system 1000 may include a camera 1100, a display 1200, an audio processor 1300, a modem 1400, DRAMs 1500a and 1500b, flash memories 1600a and 1600b, I/O devices 1700a and 1700b and an application processor 1800 (hereinafter referred to as "AP"). The system 1000 may be implemented as a laptop computer, a mobile phone, a smart phone, a tablet personal computer (PC), a wearable device, a healthcare device, or an Internet Of Things (IOT) device. In addition, the system 1000 may be implemented as a server or a personal computer.

The camera 1100 may photograph a still image or a moving image according to a user's control, and may store data of photographed image/moving image or transmit the data to the display 1200. The audio processor 1300 may process audio data included in contents of the flash memory devices 1600a and 1600b or a network. The modem 1400 may modulate and transmit a signal to transmit/receive wired/wireless data, and a receiving side may demodulate and reconstruct the signal to the original signal. The I/O devices 1700a and 1700b may include devices providing digital input and/or output functions such as a universal serial bus (USB) or storage, a digital camera, a secure digital (SD) card, a digital versatile disc (DVD), a network adapter, a touch screen, etc.

The AP 1800 may control the overall operation of the system 1000. The AP 1800 may control the display 1200 to display a part of the contents stored in the flash memory devices 1600a and 1600b. When a user input is received through the I/O devices 1700a and 1700b, the AP 1800 may perform a control operation corresponding to the user input. The AP 1800 may include an accelerator block, which is a dedicated circuit for an artificial intelligence (AI) data operation, or may include an accelerator chip 1820 separately from the AP 1800. A DRAM 1500b may be additionally mounted to the accelerator block or the accelerator chip 1820. An accelerator is a function block that professionally performs a specific function of the AP 1800. The accelerator may include a GPU that is a function block professionally performing graphic data processing, a neural processing unit (NPU) that is a block professionally performing AI calculation and inference, and a data processing unit (DPU) that is a block professionally performing data transfer.

The system 1000 may include the plurality of DRAMs 1500a and 1500b. The AP 1800 may perform communication by controlling the DRAMs 1500a and 1500b through setting of a command and MRS conforming to the Joint Electron Device Engineering Council (JEDEC) standard, or by setting a DRAM interface protocol so as to use company specific functions such as low voltage/high speed/reliability and cyclic redundancy check (CRC)/error correction code (ECC) functions. For example, the AP 1800 may communicate with the DRAM 1500a through an interface conforming to the JEDEC standard such as LPDDR4 and LPDDR5, and the accelerator block or accelerator chip 1820 may perform communication by setting a new DRAM interface protocol in order to control the DRAM 1550b for accelerator having a higher bandwidth than that of the DRAM 1500a.

Although the DRAMs 1500a and 1500b are illustrated in FIG. 17, example embodiments are not limited thereto, and if the bandwidth, response speed, and voltage conditions of the AP 1800 or the accelerator chip 1820 are satisfied, any memory such as PRAM, SRAM, MRAM, RRAM, FRAM, or Hybrid RAM may be used. The DRAMs 1500a and 1500b have relatively smaller latency and bandwidth than those of the I/O devices 1700a and 1700b or the flash memories 1600a and 1600b. The DRAMs 1500a and 1500b may be initialized at a time when the system 1000 is powered on, loaded with an operating system and application data, and may be used as temporary storage locations for the operating system and application data or as execution spaces for various software codes.

In the DRAMs 1500a and 1500b, addition/subtraction/multiplication/division operations, vector operations, address operations, or fast Fourier transform (FFT) operations may be performed. Also, a function for performing an inference may be performed in the DRAMs 1500a and 1500b. Here, the inference may be performed in a deep learning algorithm using an artificial neural network. The deep learning algorithm may include a training step of training a model through various data and an inference step of recognizing data with the trained model. As an example, an image captured by the user through the camera 1100 may be signal-processed and stored in the DRAM 1500b, and the accelerator block or the accelerator chip 1820 may perform the AI data operation of recognizing data stored in the DRAM 1500b and data using a function used in the inference.

The system 1000 may include a plurality of storage or the plurality of flash memories 1600a and 1600b having a larger capacity than those of the DRAMs 1500a and 1500b. The accelerator block or the accelerator chip 1820 may perform the training step and the AI data operation by using the flash memory devices 1600a and 1600b. In an example embodiment, the flash memories 1600a and 1600b may use an operation device included in the memory controller 1610 to more efficiently perform the training step and an inference AI data operation performed by the AP 1800 and/or the accelerator chip 1820. The flash memories 1600a and 1600b may store pictures taken through the camera 1100 or data transmitted through a data network. For example, the flash memories 1600a and 1600b may store augmented reality/virtual reality, high definition (HD), or ultra high definition (UHD) content.

The system 1000 may transmit or receive signals through a serial interface for high-speed operation between components. The camera 1100, the display 1200, the audio processor 1300, the modem 1400, the DRAMs 1500a and 1500b, the flash memories 1600a and 1600b, the I/O devices 1700a and 1700b, and/or the AP 1800 included in the system 1000 may include an asymmetric ODT circuit described with reference to FIGS. 1 to 16.

While example embodiments have been particularly shown and described, it will be understood that various changes in form and details may be made therein without departing from the spirit and scope of the following claims.

What is claimed is:

1. An apparatus connected to an external device via a signal line, the apparatus comprising:
   an on-die termination (ODT) circuit set in a first ODT state;
   a plurality of signal pins, each of which is connected to the signal line; and
   an ODT control circuit configured to:
      obtain information from the external device indicating a second ODT state of the external device,
      identify whether the second ODT state indicated by the information obtained from the external device corresponds to the first ODT state to determine whether a termination state of the apparatus is a symmetric ODT or an asymmetric ODT, and
      based on the termination state of the apparatus being the asymmetric ODT in which the first ODT state and the second ODT state are different, provide an asymmetric ODT parameter code to the external device, and disable the ODT circuit when a signal is not transmitted through the signal line.

2. The apparatus of claim 1, wherein the first ODT state is set based on a first termination resistance provided through the signal line in relation to a supply voltage, and the second ODT state is set based on a second termination resistance provided through the signal line in relation to a ground voltage.

3. The apparatus of claim 1, wherein the first ODT state is set based on a first termination resistance provided through the signal line in relation to a ground voltage, and the second ODT state is set based on a second termination resistance provided through the signal line in relation to a power voltage.

4. The apparatus of claim 1, further comprising:
a transmitter configured to transmit the signal through the signal line based on a pull-up drive code and a pull-down drive code,
wherein the transmitter comprises:
a pull-up circuit comprising first transistors connected in parallel between a power voltage and the signal line and configured to respond to the pull-up drive code; and
a pull-down circuit comprising second transistors connected in parallel between the signal line and a ground voltage and configured to respond to the pull-down drive code.

5. The apparatus of claim 4, wherein the ODT control circuit is configured to disable the ODT circuit when the transmitter transmits the signal through the signal line.

6. The apparatus of claim 4, wherein the ODT control circuit is configured to generate ODT control signals configured to control the ODT circuit,
each of the first transistors of the pull-up circuit is configured to turn on or off according to the ODT control signals to vary a first termination resistance according to an on or off state of each of the first transistors, and
when the ODT circuit is disabled, all of the first transistors are turned off.

7. The apparatus of claim 4, wherein the ODT control circuit is configured to generate ODT control signals configured to control the ODT circuit,
each of the second transistors of the pull-down circuit is configured to turn on or off according to the ODT control signals to vary a first termination resistance according to an on or off state of each of the second transistors, and
based on the ODT circuit being disabled, all of the second transistors are turned off.

8. The apparatus of claim 4, wherein each of the first transistors is a first transistor type.

9. The apparatus of claim 1, wherein the plurality of signal pins are related to a clock signal, a command signal, an address signal, and a data signal.

10. The apparatus of claim 9, further comprising:
a receiver configured to receive the data signal through the signal line connected to a signal pin related to the data signal among the plurality of signal pins.

11. The apparatus of claim 10, wherein the apparatus is configured to enable the ODT circuit when the receiver receives the signal through the signal line.

12. An apparatus comprising:
a plurality of signal pins, wherein the apparatus is connected to an external device through a signal line connected to a signal pin among the plurality of signal pins;
an on-die termination (ODT) circuit connected to the signal line, the ODT circuit being set to a first ODT state;
a mode register configured to store a first parameter code corresponding to a first operating condition of the ODT circuit and a second parameter code corresponding to a second operating condition of the ODT circuit; and
a control circuit configured to:
provide information indicating the first ODT state to the external device, and
based on a determination made by the external device using the information indicating the first ODT state, set the ODT circuit to the first operating condition using the first parameter code in a symmetric ODT where a second ODT state of the external device corresponds to the first ODT state, and set the ODT circuit to the second operating condition using the second parameter code in an asymmetric ODT where the second ODT state of the external device is different from the first ODT state.

13. The apparatus of claim 12, wherein the control circuit is configured to disable the ODT circuit when a signal is not received through the signal line according to the second operating condition of the ODT circuit.

14. The apparatus of claim 12, wherein the first parameter code is a default parameter code, and
the second parameter code is provided by the external device.

15. The apparatus of claim 12, wherein the first ODT state is set based on a first termination resistance provided through the signal line in relation to a supply voltage, and the second ODT state is set based on a second termination resistance provided through the signal line in relation to a ground voltage.

16. The apparatus of claim 12, wherein the first ODT state is set based on a first termination resistance provided through the signal line in relation to a ground voltage, and the second ODT state is set based on a second termination resistance provided through the signal line in relation to a power voltage.

17. The apparatus of claim 12, further comprising:
a receiver connected to a signal pin, from the external device among the plurality of signal pins, related to a clock signal, a command signal, an address signal, or a data signal transmitted.

18. The apparatus of claim 17, wherein the control circuit is configured to enable the ODT circuit when the receiver receives a signal through the signal pin.

19. The apparatus of claim 17, further comprising:
a transmitter configured to transmit the data signal through the signal line connected to the signal pin related to the data signal among the plurality of signal pins,
wherein the transmitter comprises:
a pull-up circuit comprising first transistors connected in parallel between a power voltage and the signal line and configured to respond to a pull-up drive code; and
a pull-down circuit comprising second transistors connected in parallel between the signal line and a ground voltage and configured to respond to a pull-down drive code.

20. The apparatus of claim 19, wherein the control circuit is configured to disable the ODT circuit when the transmitter transmits the data signal through the signal line.

* * * * *